US012803510B2

(12) United States Patent
Esmael

(10) Patent No.: US 12,803,510 B2
(45) Date of Patent: Nov. 17, 2026

(54) PROGRAMMABLE POWER AMPLIFIER FOR BEAM SCANNING

(71) Applicant: Analog Devices International Unlimited Company, County Limerick (IE)

(72) Inventor: Mohamed Moussa Ramadan Esmael, Cairo (EG)

(73) Assignee: Analog Devices International Unlimited Company, County Limerick (IE)

( * ) Notice: Subject to any disclaimer, the term of this patent is extended or adjusted under 35 U.S.C. 154(b) by 327 days.

(21) Appl. No.: 18/434,573

(22) Filed: Feb. 6, 2024

(65) Prior Publication Data

US 2024/0291447 A1 Aug. 29, 2024

Related U.S. Application Data

(60) Provisional application No. 63/487,460, filed on Feb. 28, 2023.

(51) Int. Cl.

| | |
|---|---|
| ***H03F 3/24*** | (2006.01) |
| ***H01Q 3/28*** | (2006.01) |
| ***H03F 1/02*** | (2006.01) |
| ***H03F 1/32*** | (2006.01) |
| ***H03F 1/56*** | (2006.01) |

(52) U.S. Cl.

CPC ............... *H03F 3/245* (2013.01); *H01Q 3/28* (2013.01); *H03F 1/0205* (2013.01); *H03F 1/32* (2013.01); *H03F 1/56* (2013.01); *H03F 2200/222* (2013.01); *H03F 2200/387* (2013.01); *H03F 2200/451* (2013.01)

(58) Field of Classification Search

CPC .......................... H04B 1/04; H04B 2001/0408

See application file for complete search history.

(56) References Cited

U.S. PATENT DOCUMENTS 10,680,564 B2 6/2020 Esmael et al.
10,924,063 B2 2/2021 Esmael
(Continued)

FOREIGN PATENT DOCUMENTS

CN 115548682 B 3/2023
JP 2012109752 A 6/2012

OTHER PUBLICATIONS

Berretta et al., "A Balanced CDMA2000 SiGe HBT Load Insensitive Power Amplifier," IEEE Radio and Wireless Symposium, 2006, pp. 523-526.

(Continued)

*Primary Examiner* — Ayodeji O Ayotunde
(74) *Attorney, Agent, or Firm* — Knobbe, Martens, Olson & Bear, LLP

(57) ABSTRACT

Aspects of this disclosure relate to a radio frequency system with power amplifier programming for antenna impedance variation. In certain embodiments, the radio frequency system includes a phased antenna array and a plurality of power amplifiers configured to drive the phased antenna array. A first power amplifier is programmable based on an impedance of a first antenna element of the phased antenna array. The radio frequency system is operable to perform beam scanning, and the impedance of the first antenna element varies as the radio frequency system performs beam scanning.

20 Claims, 16 Drawing Sheets

(56) References Cited

U.S. PATENT DOCUMENTS

| | | | | |
|---|---|---|---|---|
| 11,264,953 | B2 | 3/2022 | Mobarak et al. | |
| 11,303,309 | B1 | 4/2022 | Mobarak et al. | |
| 2011/0140772 | A1 | 6/2011 | Sengupta et al. | |
| 2014/0354350 | A1 | 12/2014 | Bowers et al. | |
| 2017/0345620 | A1 | 11/2017 | Coumou et al. | |
| 2019/0049532 | A1 | 2/2019 | Wang | |
| 2021/0242835 | A1 | 8/2021 | Mobarak et al. | |
| 2021/0344307 | A1 | 11/2021 | Tokuda | |
| 2021/0399700 | A1* | 12/2021 | Kultran | H03F 3/195 |
| 2022/0094306 | A1 | 3/2022 | Esmael | |
| 2022/0247365 | A1* | 8/2022 | Pehlke | H04B 1/04 |
| 2024/0291443 | A1 | 8/2024 | Esmael | |
| 2024/0291444 | A1 | 8/2024 | Esmael | |

OTHER PUBLICATIONS

Ji et al., "A Novel Load Insensitive RF Power Amplifier Using a Load Mismatch Detection and Curing Technique", IEEE Radio Frequency Integrated Circuits Symposium, 2013, pp. 341-344.

Van Bezooijen et al., "Adaptive Methods to Preserve Power Amplifier Linearity Under Antenna Mismatch Conditions," IEEE Transactions on Circuits and Systems, Oct. 2005, 52(10): pp. 2101-2108.

Extended European Search Report issued in European Patent Application No. 24159189.0, dated Aug. 23, 2024.

* cited by examiner

| Beam ID "Beam θ" | Azimuth Angle | Elevation Angle | PA1 Optimum Control Bits | PA2 Optimum Control Bits |
|---|---|---|---|---|
| 1 (Main) | 0 | 0 | Set_1 (Bias, Coupling, Linearization, Vcas Voltages, Input Matching ,and Output Matching) | Set_1 (Bias, Coupling ,Linearization, Vcas Voltages, Input Matching ,and Output Matching) |
| 2 | -1*Ø | α | Set_2 (Bias, Coupling ,Linearization, Vcas Voltages, Input Matching2 ,and Output Matching1) | Set_2 (Bias, Coupling ,Linearization, Vcas Voltages, Input Matching2 ,and Output Matching2) |
| 3 | -2*Ø | α | | |
| ••• | ••• | ••• | | |
| M-1 | (M-1)Ø | α | Set_M-1 (Bias, Coupling, Linearization, Vcas Voltages, Input Matching ,and Output Matching) | Set_M-1 (Bias, Coupling , Linearization, Vcas Voltages, Input Matching ,and Output Matching) |
| M | ••• | ••• | Set_M (Bias, Coupling, Linearization, Vcas Voltages, Input Matching2 ,and Output Matching1) | Set_M (Bias, Coupling , Linearization, Vcas Voltages, Input Matching2 ,and Output Matching2) |

FIG. 6B

| Beam ID | Azimuth Angle | Elevation Angle | PA1 Control Bit | PA2 Control Bit |
|---|---|---|---|---|
| 1 (Main) | 0 | 0 | Set_1 | Set_1 |
| 2 | -1*Ø | α | Set_2 | Set_2 |
| 3 | -2*Ø | α | | |
| ••• | ••• | ••• | | |
| M-1 | (M-1)Ø | α | Set _ M-1 | Set _ M-1 |
| M | ••• | ••• | Set _ M | Set _ M |

105

| PA1 VSWR Bits | PA2 VSWR Bits | VSWR Detector Impedance |
|---|---|---|
| Control Set_1 | Control Set_1 | Impedance Group_1 |
| Control Set_2 | Control Set_2 | Impedance Group_2 |
| : | : | : |
| Control Set_m | Control Set_m | Impedance Group_m |

PROGRAMMABLE POWER AMPLIFIER FOR BEAM SCANNING

CROSS REFERENCE TO RELATED APPLICATIONS

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/487,460, filed Feb. 28, 2023 and titled "PROGRAMMABLE MULTI-CORE POWER AMPLIFIER FOR LOAD IMPEDANCE VARIATION," the disclosure of which is hereby incorporated by reference in its entirety and for all purposes. The present application relates to U.S. patent application Ser. No. 18/434,493, titled "PROGRAMMABLE MULTI-CORE POWER AMPLIFIER FOR LOAD IMPEDANCE VARIATION," filed on even date herewith, the entire disclosure of which is hereby incorporated by reference herein and for all purposes. The present application relates to U.S. patent application Ser. No. 18/434,539, titled "POWER AMPLIFIER CALIBRATION FOR LOAD IMPEDANCE VARIATION," filed on even date herewith, the entire disclosure of which is hereby incorporated by reference herein and for all purposes.

BACKGROUND

Technical Field

The disclosed technology relates to radio frequency systems and power amplifiers. Embodiments of this disclosure relate to a power amplifier operable to adjust for a variation in load impedance.

Description of Related Technology

Radio systems can transmit and receive signals in the form of electromagnetic waves having a frequency in range from approximately 30 kilohertz (kHz) to 300 Gigahertz (GHz). Radio systems can be used for wireless communications, such as cellular communications and/or other wireless network communications.

Radio systems that transmit signals often include a power amplifier to amplify a radio frequency signal for transmission via one or more antennas. Power amplifiers can encounter technical challenges related to efficiency, output power, and/or linearity. High performance power amplifiers are desired.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a power amplifier circuit that is programmable for variations in load impedance. The power amplifier circuit includes a first power amplifier segment and a second power amplifier segment. The first power amplifier segment includes a first power amplifier core. The second power amplifier segment includes a second power amplifier core. The second power amplifier segment is in parallel with the first power amplifier segment such that the second power amplifier segment and the second power amplifier segment are operable to together drive a load having an impedance that varies. The second power amplifier segment is programmable based on the impedance of the load such that the second power amplifier segment is programmed differently for different values of the impedance of the load.

The power amplifier circuit can program the second power amplifier segment based on the impedance of the load to increase linearity of the power amplifier circuit. The power amplifier circuit can program the second power amplifier segment based on the impedance of the load to increase efficiency of the power amplifier circuit.

The first power amplifier segment can be programmable based on the impedance of the load.

The second power amplifier segment can be programmable to at least adjust a bias signal for the second power amplifier core based on the impedance of the load. The first power amplifier core can include one or more first transistors, the second power amplifier core can include one or more second transistors, and a bias signal and a capacitance for each input of the one or more first and second transistors can be programmable based on the impedance of the load. The second power amplifier segment can be programmable to at least adjust a bias current for the second power amplifier core based on the impedance of the load. The second power amplifier segment can be programmable to at least adjust a supply voltage for the second power amplifier core based on the impedance of the load. The second power amplifier segment can be programmable to at least adjust an input matching network for the second power amplifier core based on the impedance of the load. The second power amplifier segment can be programmable to at least adjust an output matching network for the second power amplifier core based on the impedance of the load to improve linearity performance of the power amplifier circuit. The second power amplifier segment can be programmable to at least adjust a coupling circuit based on the impedance of the load, the coupling circuit configured to couple part of the second power amplifier core input power to a linearization circuit of the second power amplifier segment. The second power amplifier segment can be programmable to at least adjust an adaptive bias circuit that is configured to generate a bias signal for the second power amplifier core based on the impedance of the load, the bias signal including a direct current component, at least one tone component, and at least one harmonic of the at least one tone component. The second power amplifier segment can be programmable to adjust at least two of the following based on the impedance of the load: a bias voltage for the second power amplifier core, a bias current for the second power amplifier core, a supply voltage for the second power amplifier core, an input matching network for the second power amplifier core, an output matching network for the second power amplifier core, a coupling circuit that couples input power to the second power amplifier core, or an adaptive bias circuit for the second power amplifier core. For example, the second power amplifier segment can be programmable to adjust an input matching network for the second power amplifier core and an adaptive bias circuit for the second power amplifier core based on the impedance of the load.

The load can be an antenna element of a phased antenna array.

The second power amplifier segment can be programmable based on the impedance of the load such that the second power amplifier segment is programmed differently for different load voltage standing wave ratios.

The first power amplifier segment can include a first adaptive bias circuit configured to generate a first bias signal for the first power amplifier core, the first bias signal having a first direct current component, at least one first tone component, and at least one harmonic of the at least one first tone component. The second power amplifier segment can include a second adaptive bias circuit configured to generate a second bias signal for the second power amplifier core, the second bias signal having a second direct current component, at least one second tone component, and at least one harmonic of the at least one second tone component.

Another aspect of this disclosure is a method of programming a power amplifier circuit for radio frequency signal amplification. The method includes amplifying a radio frequency signal with a power amplifier circuit driving a load impedance having a first value. The power amplifier circuit includes a first power amplifier segment and a second power amplifier segment, in which the first power amplifier segment includes a first power amplifier core and the second power amplifier segment includes a second power amplifier core. The method includes programming at least the second power amplifier segment based on an indication of the load impedance such that the second power amplifier segment is programmed differently for the loading impedance having a second value than for the load impedance having the first value. The method includes amplifying, after the programming, the radio frequency signal with the power amplifier circuit driving the load impedance having the second value.

The programming can include adjusting an input matching network for the second power amplifier core. The programming an include adjusting a bias for the second power amplifier core generated by an adaptive bias circuit.

Another aspect of this disclosure is a power amplifier circuit that is programmable for variations in load impedance. The power amplifier circuit includes a first power amplifier segment, a second power amplifier segment, and a control circuit. The first power amplifier segment includes a first power amplifier core, a first input matching network connected to an input of the first power amplifier core, and a first adaptive bias circuit configured to generate a first bias signal for the first power amplifier core. The second power amplifier segment includes a second power amplifier core, a second input matching network connected to an input of the second power amplifier core, and a second adaptive bias circuit configured to generate a second bias signal for the second power amplifier core. The second power amplifier segment is in parallel with the first power amplifier segment such that the second power amplifier segment and the second power amplifier segment are operable to together drive a load. The control circuit is configured to program the first input matching network, the first adaptive bias circuit, the second input matching network, and the second adaptive bias circuit based on the impedance of the load such that the power amplifier circuit is programmed differently for different values of the impedance of the load.

Another aspect of this disclosure is a radio frequency system with power amplifier programming for antenna impedance variation. The radio frequency system includes a phased antenna array and a plurality of power amplifiers. The phased antenna array includes a first antenna element and a second antenna element. The plurality of power amplifiers includes a first power amplifier operable to drive the first antenna element and a second power amplifier operable to drive the second antenna element. The first power amplifier is programmable based on an impedance of the first antenna element. The radio frequency system is operable to perform beam scanning. The impedance of the first antenna element varies as the radio frequency system performs beam scanning.

The first power amplifier can include a multi-core power amplifier including a plurality of power amplifier cores. Each power amplifier core of the plurality of power amplifier cores can be programmable based on the impedance of the first antenna element.

The second power amplifier can be programmable based on an impedance of the second antenna element, and the impedance of the second antenna element can vary as the radio frequency system performs beam scanning.

The second power amplifier can be programmable based on the impedance of the first antenna element.

The first power amplifier can be programmable to adjust at least one of a bias current or a bias voltage for the first power amplifier based on the impedance of the first antenna element. The first power amplifier can be programmable to adjust at least one of an input matching network or an output matching network based on the impedance of the first antenna element. The first power amplifier can be programmable to adjust an input matching network based on the impedance of the first antenna element to increase linearity of the first power amplifier. The first power amplifier can be programmable to adjust an adaptive bias circuit based on the impedance of the first antenna element to improve increase of the first power amplifier. The first power amplifier is programmable to adjust at least two of the following based on the impedance of the first antenna element: a bias voltage, a bias current, an input matching network, or an output matching network.

The radio frequency system can include a radio frequency coupler in a signal path between the first power amplifier and the first antenna element, and a detector in communication with the radio frequency coupler. The detector can be operable to generate an indication of reflected radio frequency power, in which the reflected radio frequency power is an indication of the impedance of the first antenna element, and in which the first power amplifier is programmable based on the indication of reflected power.

The first power amplifier can be programmable based on an indication of beam angle.

The phased antenna array comprises at least 36 antenna elements.

Another aspect of this disclosure is a method of power amplifier programming for antenna impedance variation. The method includes programming a power amplifier driving an antenna element of a phased antenna array for a first impedance value of the antenna element. The first impedance value corresponds to the phased antenna array generating a first beam with a first beam angle. The phased antenna array includes a plurality of antenna elements that includes the antenna element. The method includes programming the power amplifier for a second impedance value of the antenna element. The second impedance value corresponds to the phased antenna array generating a second beam with a second beam angle. The method includes controlling the phased antenna array to generate the first beam and the second beam. The power amplifier is programmed for the first impedance value while the first beam is generated, and the power amplifier is programmed for the second impedance value while the second beam is generated.

The method can include accessing control information stored in memory associated with the first beam. The programming the power amplifier for the first impedance value can be based on the accessing.

The method can include detecting an indication of impedance of the antenna element and accessing control information stored in memory associated with the impedance of the antenna element. The programming the power amplifier for the first impedance can be based on the accessing.

The programming the power amplifier for the second impedance value can include adjusting an input matching network of the power amplifier to improve linearity of the power amplifier.

The programming the power amplifier for the second impedance can include adjusting an adaptive bias circuit of the power amplifier to improve linearity of the power amplifier.

The power amplifier can be a multi-core power amplifier that includes a plurality of power amplifier cores. Each power amplifier core of the plurality of power amplifier cores can be programmable for generating the first beam and for generating the second beam.

The method can include programming a second power amplifier driving a second antenna element of the plurality of antenna elements differently for generating the first beam and for generating the second beam.

Another aspect of this disclosure is a radio frequency system with power amplifier programming for antenna impedance variation. The radio frequency system includes a phased antenna array and a plurality of power amplifiers. The phased antenna array includes a first antenna element and a second antenna element. The plurality of power amplifiers includes a first multi-core power amplifier operable to drive the first antenna element and a second multi-core power amplifier operable to drive the second antenna element. The first multi-core power amplifier is programmable to adjust at least a matching network and a bias signal based on an impedance of the first antenna element. The radio frequency system is operable to perform beam scanning. The impedance of the first antenna element varies as the radio frequency system performs beam scanning.

Another aspect of this disclosure is a method of generating calibration data for power amplifier programming for load impedance variation. The method includes determining, for a first impedance value of a load, one or more power amplifier parameters for a power amplifier driving the load. The method includes determining, for a second impedance value of the load, the one or more power amplifier parameters for the power amplifier. The second impedance value is different than the first impedance value. The method includes storing, to memory, the one or more power amplifier parameters for the first and second impedance values such that the one or more power amplifier parameters for the first and second impedance values are accessible to program the power amplifier.

The power amplifier can be a multi-core power amplifier that includes a first power amplifier core and a second power amplifier core. The first power amplifier core and the second power amplifier core can be separately programmable. The one or more power amplifier parameters can be associated with at least a matching network and a bias signal for the first power amplifier core.

The method can include generating a first beam and a second beam with a phased antenna array, in which the load includes an antenna element of the phased antenna array. The antenna element can have the first impedance value while the first beam is generated and the second impedance value while the second beam is generated. The determining, for the first impedance value and the second impedance value of the load, the one or more power amplifier parameters can be performed based on measurements associated with the generating.

The method can include programming the power amplifier using the one or more power amplifier parameters for the first impedance value of the load and for the second impedance value of the load. The method can include generating a first beam and a second beam with a phased antenna array, in which the load includes an antenna element of the phased antenna array and the antenna element has the first impedance value while the first beam is generated and the second impedance value while the second beam is generated.

The determining, for the first impedance value of the load, the one or more power amplifier parameters can be based on a signal received over-the-air. The determining, for the first impedance value of the load, the one or more power amplifier parameters can include analyzing a performance parameter of the signal received over the air. The performance parameter can be representative of at least one of error vector magnitude, adjacent channel power, linearity, AM-AM, output power versus gain, or gain versus power.

The determining, for the first impedance value of the load, the one or more power amplifier parameters can be based on a measurement generated using a radio frequency coupler and a detector.

The determining, for the first impedance value of the load, the one or more power amplifier parameters can include sweeping at least one of the one or more power amplifier parameters.

The power amplifier can be configured to drive an antenna element of a phased antenna array. The first impedance value of the load can correspond to a first beam angle of a first beam generated by the phased antenna array and the second impedance value of the load van correspond to a second beam angle of a second beam generated by the phased antenna array.

The method can include determining, for a plurality of additional impedance values of the load, the one or more power amplifier parameters for the power amplifier.

The one or more power amplifier parameters can be associated with at least one of a bias voltage for the power amplifier, a bias current for the power amplifier, a supply voltage for the power amplifier, an input matching network for the power amplifier, an output matching network for the power amplifier, a coupling circuit that couples input power to the power amplifier, or an adaptive bias circuit for the power amplifier. At least one of the one or more power amplifier parameters can be associated with an input matching network for the power amplifier. At least one of the one or more power amplifier parameters can be associated with an adaptive bias signal for the power amplifier.

Another aspect of this disclosure is a method of generating calibration data for power amplifier programming for different beam angles. The method includes generating a first beam having a first beam angle with a phased antenna array, the phased antenna array comprising an antenna element and a plurality of additional antenna elements, the antenna element being driven by a power amplifier; determining, for the first beam angle, one or more power amplifier parameters for the power amplifier; generating a second beam having a second beam angle with the phased antenna array, the second beam angle being different than the first beam angle; determining, for the second beam angle, one or more power amplifier parameters for the power amplifier; and storing, to memory, the one or more power amplifier parameters for the first and second beam angles such that the one or more power amplifier parameters for the first and second beam angles are accessible to program the power amplifier.

Another aspect of this disclosure is a power amplifier system that includes an antenna array comprising an antenna element and one or more additional antenna elements; a power amplifier configured to drive the antenna element; and a memory configured to store one or more power amplifier parameters for the power amplifier. The power amplifier system is configured to generate a first beam using the antenna array and a second beam using the antenna array, the first beam having a different beam angle than the second beam. The power amplifier system is configured to determine the one or more power amplifier parameters for the first beam and store the one or more power amplifier parameters for the first beam to the memory. The power amplifier system is configured to determine the one or more power amplifier parameters for the second beam and store the one or more power amplifier parameters for the second beam to the memory.

The power amplifier can be a multi-core power amplifier that includes a first power amplifier core and a second power amplifier core. The first power amplifier core and the second power amplifier core can be separately programmable.

The power amplifier can include a matching network and an adaptive bias circuit. The one or more power amplifier parameters can be associated with at least the matching network and the adaptive bias circuit.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

FIG. 6B is a table summarizing example control bits for beam positions according to an embodiment.

DETAILED DESCRIPTION OF CERTAIN EMBODIMENTS

Figure 1:
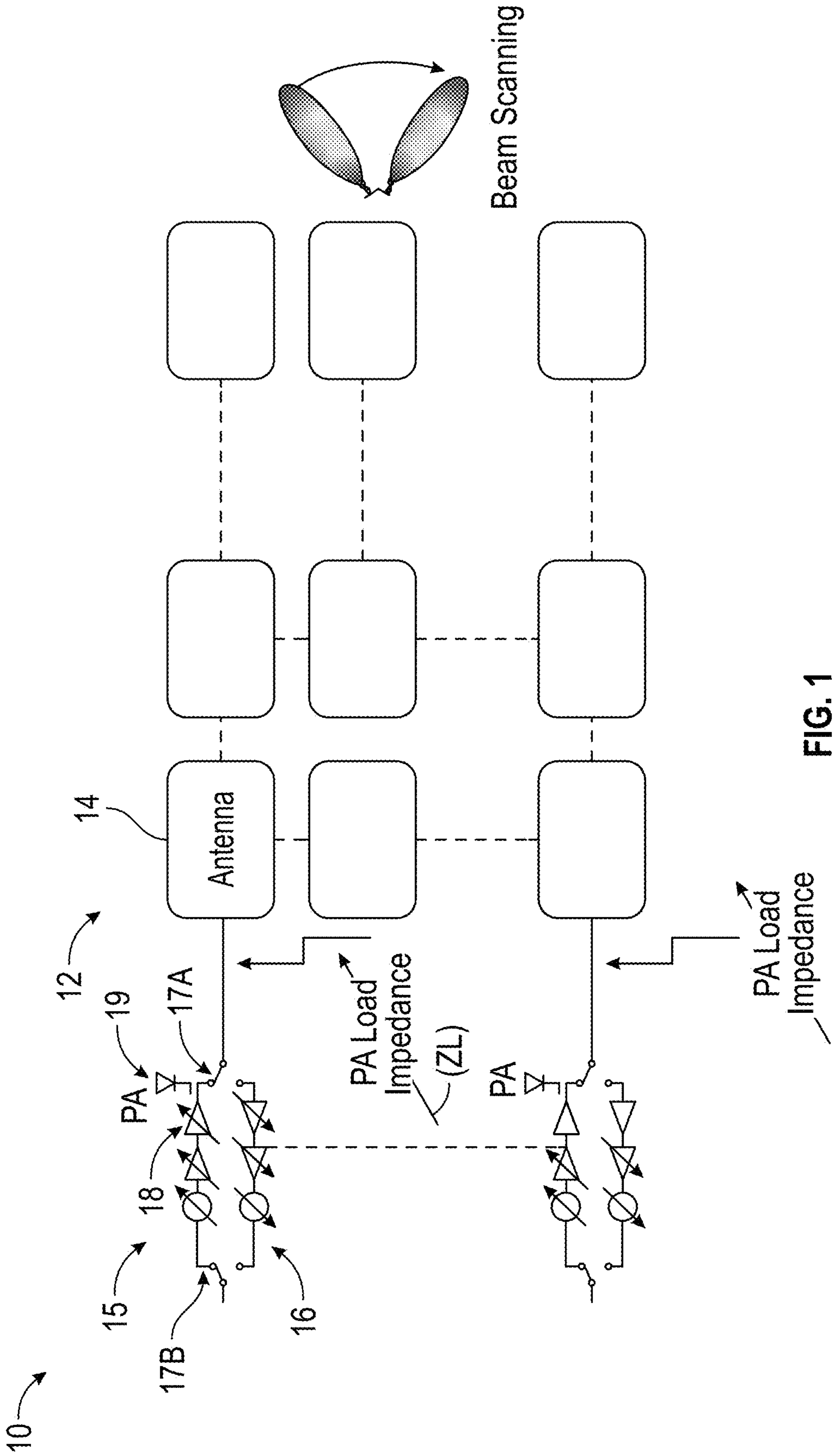
FIG. 1 is a schematic diagram of a radio frequency system with a phased antenna array according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Power amplifiers are significant components of fifth generation (5G) transmitters. Power amplifiers can have a significant contribution to overall system efficiency, linearity, and/or output power. A power amplifier can drive individual antenna element of a phased antenna array in certain applications. There can be a voltage standing wave ratio (VSWR) variation due to antenna element coupling shifting power amplifier load impedance away from an optimal value. This VSWR variation can significantly degrade power amplifier performance in a power amplifier system. For example, VSWR variation can degrade one or more of efficiency, linearity, or output power absent compensation. This disclosure provides technical solutions to improve performance for power amplifier systems as load impedance varies. For example, this disclosure provides technical solutions to improve VSWR variation sensitivity for a multi-core power amplifier. Such a multi-core power amplifier can be implemented in millimeter wave (mm-wave) 5G beamformers and/or sixth generation (6G) beamformers.

Aspects of this disclosure relate to multi-core power amplifiers where an individual power amplifier core can be programmed based on an output load of the multi-core power amplifier. The individual power amplifier core can be programmed differently for different load impedance levels to achieve desirable performance, such as desirable linearity and efficiency, as load impedance varies. For example, the individual power amplifier core can be programmed as VSWR changes. More than one individual core of the multi-power amplifier can be programmed for different load impedance levels. An individual power amplifier core can be programmed by setting and/or adjusting one or more of bias current, bias voltage, power supply voltage, input matching network, output matching network, combined output matching network for the multi-core power amplifier, or the like.

Multi-core power amplifiers can achieve high efficiency and linearity. An example multi-core power amplifier is disclosed in U.S. Patent Publication No. 2022/0094306, the disclosure of which is hereby incorporated by reference in its entirety and for all purposes. Multi-core power amplifiers can be implemented in 5G and/or 6G phased antenna array systems and applications, for example. Reduced VSWR sensitivity in such systems and applications can be improved with technical solutions disclosed herein.

5G communication systems can include phased antenna arrays for beamforming. Antenna elements in a phased antenna array can couple to each other during beam scanning. This can result in antenna elements having an impedance that deviates from a nominal 50Ω impedance. This phenomenon can be referred to as antenna voltage standing wave ratio (VSWR) variation.

Power Amplifiers with Programming for Load Impedance Variation

FIG. 1 is a schematic diagram of a radio frequency system 10 with a phased antenna array 12 according to an embodiment. The phased antenna array 12 includes an array of antenna elements 14. The radio frequency system 10 includes a plurality of processing channels each associated with a respective antenna element 14. The processing channels can each include a transmit path 15 and a receive path 16. Switches 17A and 17B can selectively electrically couple the transmit path 15 or the receive path 16 to an antenna element 14 and a transceiver (not shown in FIG. 1). Each transmit path 15 includes a power amplifier 18. The radio frequency system 10 can use the antenna elements 14 to perform beam scanning.

The antenna elements 14 are driven by the power amplifiers 18 in the transmit paths 15. In certain applications, the power amplifiers 18 can include multi-core power amplifiers that are programmable in accordance with any suitable principles and advantages disclosed herein.

As the radio frequency system 10 preforms beam scanning, the impedance of an antenna element 14 can vary. This impedance variation can be due to coupling with other antenna elements 14 in the phased antenna array 12. Power detection circuitry 19 for a transmit path can detect an indication of reflected power, such as VSWR. This indication of reflected power is indicative of impedance of an antenna element 14. The power detection circuitry 19 can include a radio frequency coupler and a power detector.

Figure 2:
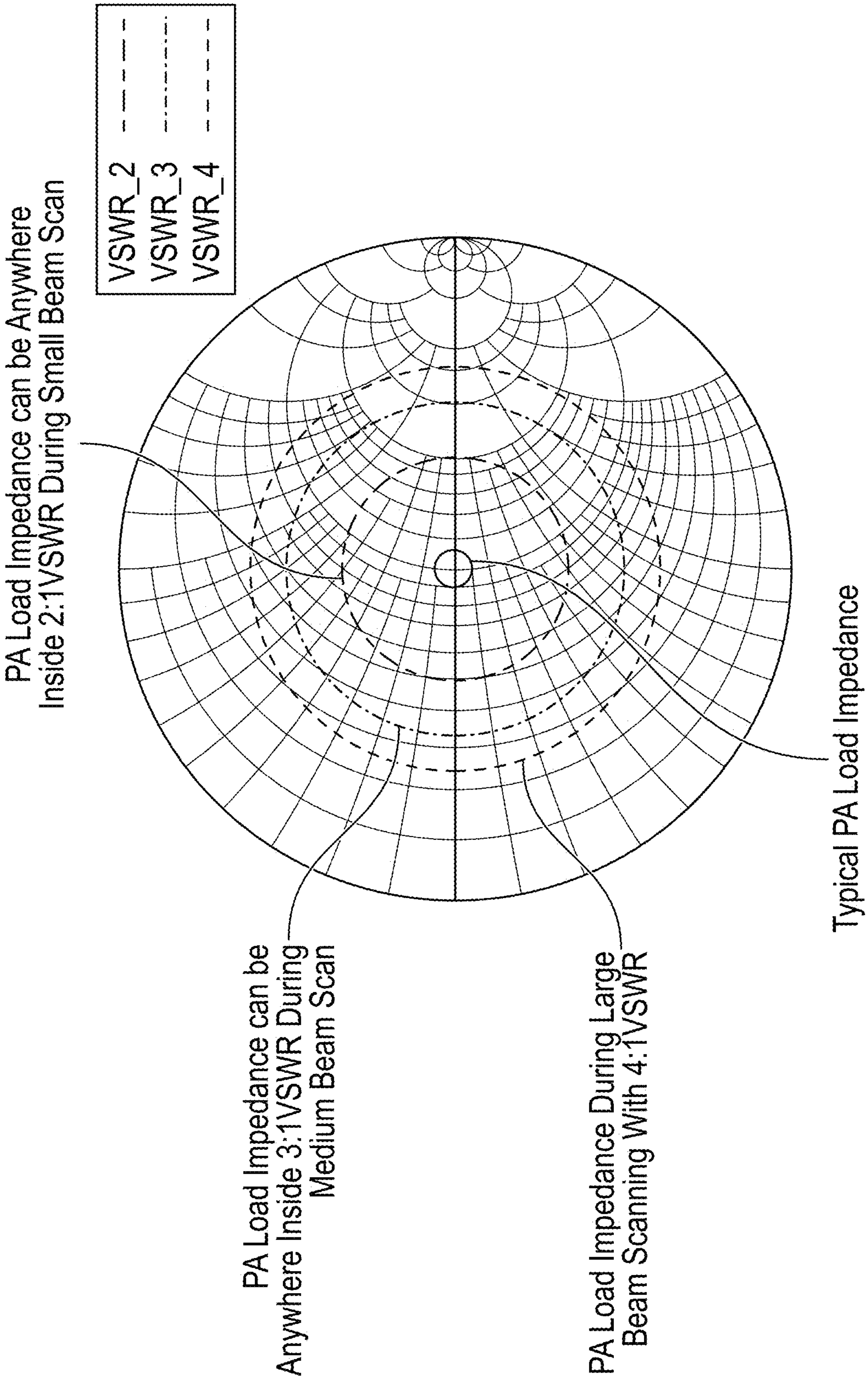
FIG. 2 is a Smith chart associated with power amplifier load impedance having different voltage standing wave ratios (VSWRs).

FIG. 2 is a Smith chart associated with power amplifier load impedance for a power amplifier 18 of FIG. 1 having different VSWR variations. In the radio frequency system 10 of FIG. 1, there can be 2:1 or 3:1 VSWR variation even for well-designed relatively low-coupling antenna arrays. VSWR variation can be around 4:1 for relatively large scanning angles and dual polarization arrays. In FIG. 2, power amplifier load impedance can be within the circle for a VSWR variation of 2:1 on the Smith chart during a relatively small beam scan. Power amplifier load impedance can be within the circle for a VSWR variation of 3:1 on the Smith chart during a medium beam scan. Power amplifier load impedance can be within the circle for a VSWR variation of 4:1 on the Smith chart during a relatively large beam scan. These circles for VSWR variations are outside of the small center circuit for typical power amplifier load impedance that is at or close to a nominal impedance of 50Ω. The VSWR variation due to antenna element coupling can shift power amplifier load impedance (ZL) away from its optimal value. This can significantly degrade the efficiency, output power, and linearity of the power amplifier.

Technical solutions in this disclosure can improve VSWR variation sensitivity for multi-core power amplifiers in mm-wave 5G beamformers and/or 6G beamformers.

Figure 3:
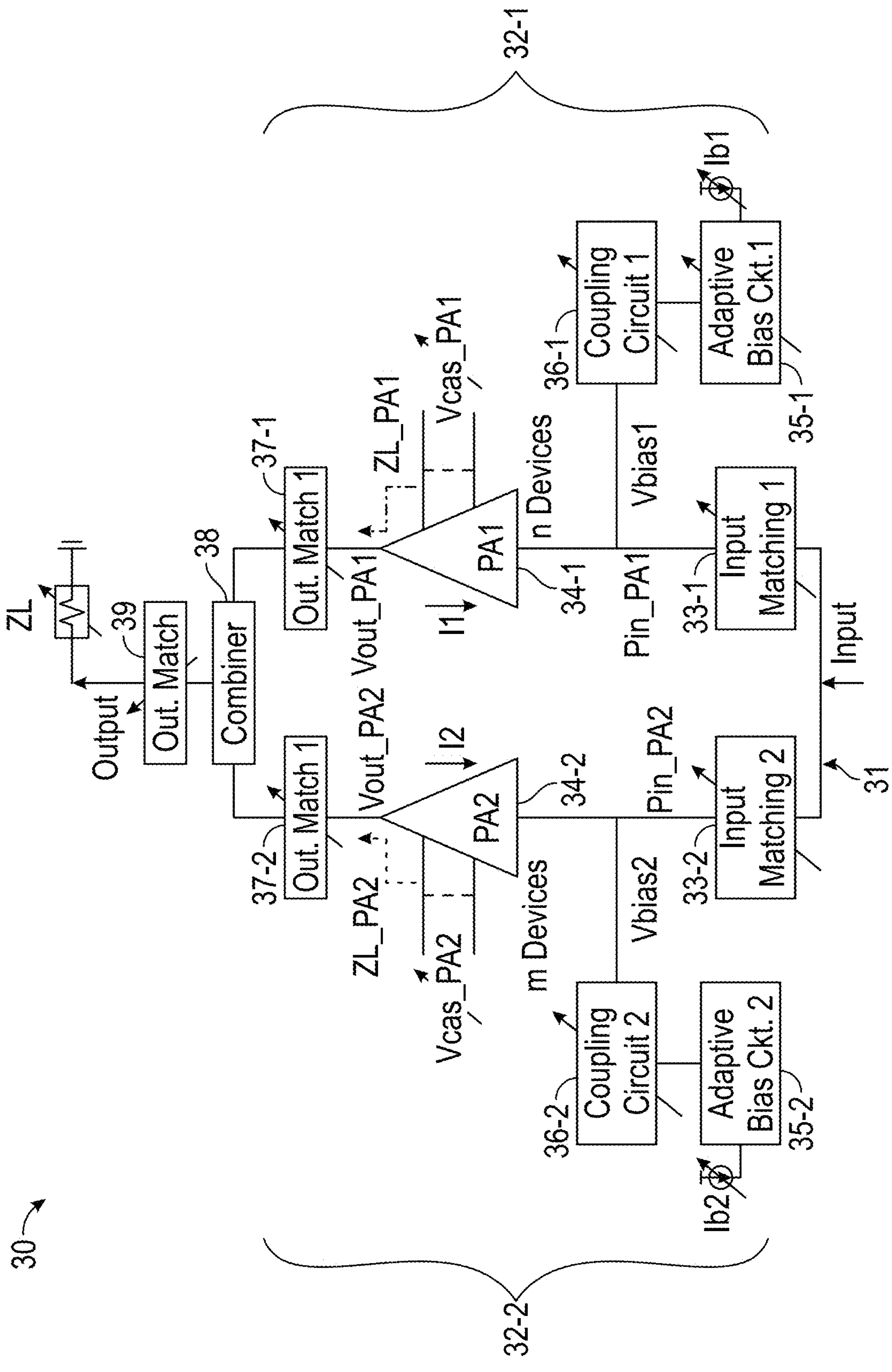
FIG. 3 is a schematic diagram of a programmable multi-core power amplifier according to an embodiment.

FIG. 3 is a schematic diagram of a multi-core power amplifier circuit 30 according to an embodiment. The multi-core power amplifier circuit 30 is programmable. As illustrated in FIG. 3, the multi-core power amplifier circuit 30 includes two power amplifier cores with programmable parameters. One or more of the programmable parameters can be adjusted for different load impedances to achieve a desired power amplifier performance. For example, power amplifier parameters can be programmed differently for different VSWRs to enhance performance of the multi-core power amplifier circuit 30. In various embodiments, the multi-core power amplifier circuit 30 can be included in a variety of different devices, such as, but not limited to, a base station of a wireless cellular network, another network node of a communications network, an access point of a wireless network, a mobile device (e.g., a user equipment (UE) of a wireless cellular network), or a radio frequency transmitter of a cable communications network.

The illustrated multi-core power amplifier circuit 30 includes a first power amplifier segment 32-1 and a second power amplifier segment 32-2. The first power amplifier segment 32-1 and the second power amplifier segment 32-2 are coupled in parallel with each other. While two power amplifier segments are illustrated in FIG. 3, a multi-core power amplifier can include three or more segments in certain applications. Circuitry of the first power amplifier segment 32-1 and the second power amplifier segment 32-2 are adjustable to make the multi-core power amplifier circuit 30 programmable.

The first power amplifier segment 32-1 includes a first input matching network 33-1 connected to an input node Input, a first power amplifier core 34-1, a first adaptive bias circuit 35-1 to generate a bias signal for the first power amplifier core 34-1, a first coupling circuit 36-1, and a first output matching network 37-1. The second power amplifier segment 32-2 includes a second input matching network 33-2 connected to the input node Input, a second power amplifier core 34-2, a second adaptive bias circuit 35-2, a second coupling circuit 36-2, and a second output matching network 37-2.

The power amplifier cores 34-1 and 34-2 can be any suitable power amplifiers, such as, but not limited to, a Doherty power amplifier, a class-A power amplifier, a class-B power amplifier, a class-AB power amplifier, or a class-C power amplifier. In certain applications, the first power amplifier core 34-1 can be a different class amplifier than the second power amplifier core 34-2. For example, the first power amplifier core 34-1 can be a class-B power amplifier and the second power amplifier core 34-2 can be a class-C power amplifier in some applications. The power amplifier cores 34-1 and 34-2 can include any suitable power amplifier transistors, such as, but not limited to, field effect transistors (e.g., metal oxide semiconductor field effect transistors (MOSFETs), p-type field effect transistors (PFETs), n-type field effect transistors (NFETs), or pseudomorphic high electron mobility transistors (pHEMPTs)) or bipolar transistors.

An input signal at an input node Input can be split by a splitter 31 to a first signal for the first power amplifier segment 32-1 and a second signal the second power amplifier segment 32-2. The first input matching network 33-1 can perform input matching for the first power amplifier core 34-1. The second input matching network 33-2 can perform input matching for the second power amplifier core 34-2.

The first signal can be amplified by the first power amplifier core 34-1. Similarly, the second signal can be amplified by the second power amplifier core 34-2. The first power amplifier core 34-1 can have a different number of power amplifier transistors than the second power amplifier core 34-2.

The first output matching network 37-1 can perform output matching for the first power amplifier core 34-1. The second output matching network 37-2 can perform output matching for the second power amplifier core 34-2.

Output signals from the output matching networks 37-1 and 37-2 can be combined with a combiner 38 to generate a combined power amplifier output signal. A combined output matching network 39 can be coupled between an output of the combiner 38 and an output node Output of the multi-core power amplifier circuit 30. An output load impedance ZL at the output node Output can represent the output impedance of the load driven by the multi-core power amplifier circuit 30.

A load impedance ZL_PA1 for the first power amplifier core 34-1 can be a function of output impedance ZL for the multi-core power amplifier circuit 30, output current Iout_PA2 for the second power amplifier core 34-2, output voltage Vout_PA2 for the second power amplifier core 34-2, impedance of the first output matching network 37-1, impedance of the second output matching network 37-2, and impedance of the combined output matching network 39.

A load impedance ZL_PA2 for the second power amplifier core 34-2 can be a function of output impedance ZL for the multi-core power amplifier circuit 30, output current Iout_PA1 for the first power amplifier core 34-1, output voltage Vout_PA1 for the first power amplifier core 34-1, impedance of the second output matching network 37-2, impedance of the first output matching network 37-1, and impedance of the combined output matching network 39.

In a multi-core power amplifier with N cores, the output current Iout_PAn for an N-th power amplifier can be a function of impedance of an N-th input matching network, an N-th coupling circuit, an N-th adaptive bias circuit, an N-th bias value, and an N-th device size of power amplifier transistors of the N-th power amplifier.

In the multi-core power amplifier with N cores, the output voltage Vout_PAn for the N-th power amplifier an N-th power amplifier can be a function of output current Iout_Pan for impedance of an N-th power amplifier, a number of stacked power amplifier transistors in the N-th power amplifier, a supply voltage Vdd_PAn for the N-th power amplifier, a load ZL_PAm of another power amplifier of the multi-core power amplifier circuit 30, and a cascode voltage Vcas_PAn for the N-th power amplifier.

As the output impedance ZL for the multi-core power amplifier circuit 30 changes, both the load impedance ZL_PA1 for the first power amplifier core 34-1 and the load impedance ZL_PA2 for the second power amplifier core 34-2 can change. This impedance variation can change from an optimal value and performance of the multi-core power amplifier circuit 30 can be degraded.

In the multi-core power amplifier circuit 30, calibrating power amplifier parameters to enhance and/or optimize output current Iout_PA1 of the first power amplifier core 34-1, output voltage Vout_PA1 of the first power amplifier core 34-1, output current Iout_PA2 of the second power amplifier core 34-2, and output voltage Vout_PA2 of the second power amplifier core 34-2, can bring the load impedance ZL_PA1 for the first power amplifier core 34-1 and the load impedance ZL_PA2 near the optimal values. Accordingly, desirable power amplifier performance can be achieved by programming power amplifier parameters of the multi-core power amplifier circuit 30.

The multi-core power amplifier circuit 30 can be programmed to achieve output currents and output voltages for individual power amplifiers in a variety of ways. VSWR sensitivity and/or other output load impedance variation sensitivity can be reduced or eliminated in a variety of ways. One of more of the following adjustments and/or one or more other adjustments in the multi-core power amplifier circuit 30 can be implemented together with each other.

By adjusting impedance of the first input matching network 33-1 and/or the second input matching network 33-2, VSWR sensitivity can be reduced. Adjusting the input matching impedance in one or more power amplifier segments 32-1 and/or 32-2 can restore nonlinearity cancellation at the output node Output of the multi-core power amplifier circuit 30 while maintaining efficiency.

By adjusting power amplifier input linearization using the first coupling circuit 36-1 and/or the second coupling circuit 36-2, VSWR sensitivity can be reduced. Adjusting the power amplifier input linearization can restore nonlinearity cancellation at the output node Output of the multi-core power amplifier circuit 30 while maintaining efficiency.

By adjusting power amplifier bias voltage using the first adaptive bias circuit 35-1 and/or the second adaptive bias circuit 35-2, VSWR sensitivity can be reduced. Adjusting the power amplifier bias voltage can restore nonlinearity cancellation at the output node Output of the multi-core power amplifier circuit 30 while maintaining efficiency.

By adjusting power amplifier cascode bias voltage Vcas_PA1 and/or Vcas_PA2, VSWR sensitivity can be reduced. Adjusting the power amplifier cascode bias voltage can restore nonlinearity cancellation at the output node Output of the multi-core power amplifier circuit 30 while maintaining efficiency.

Figure 4:
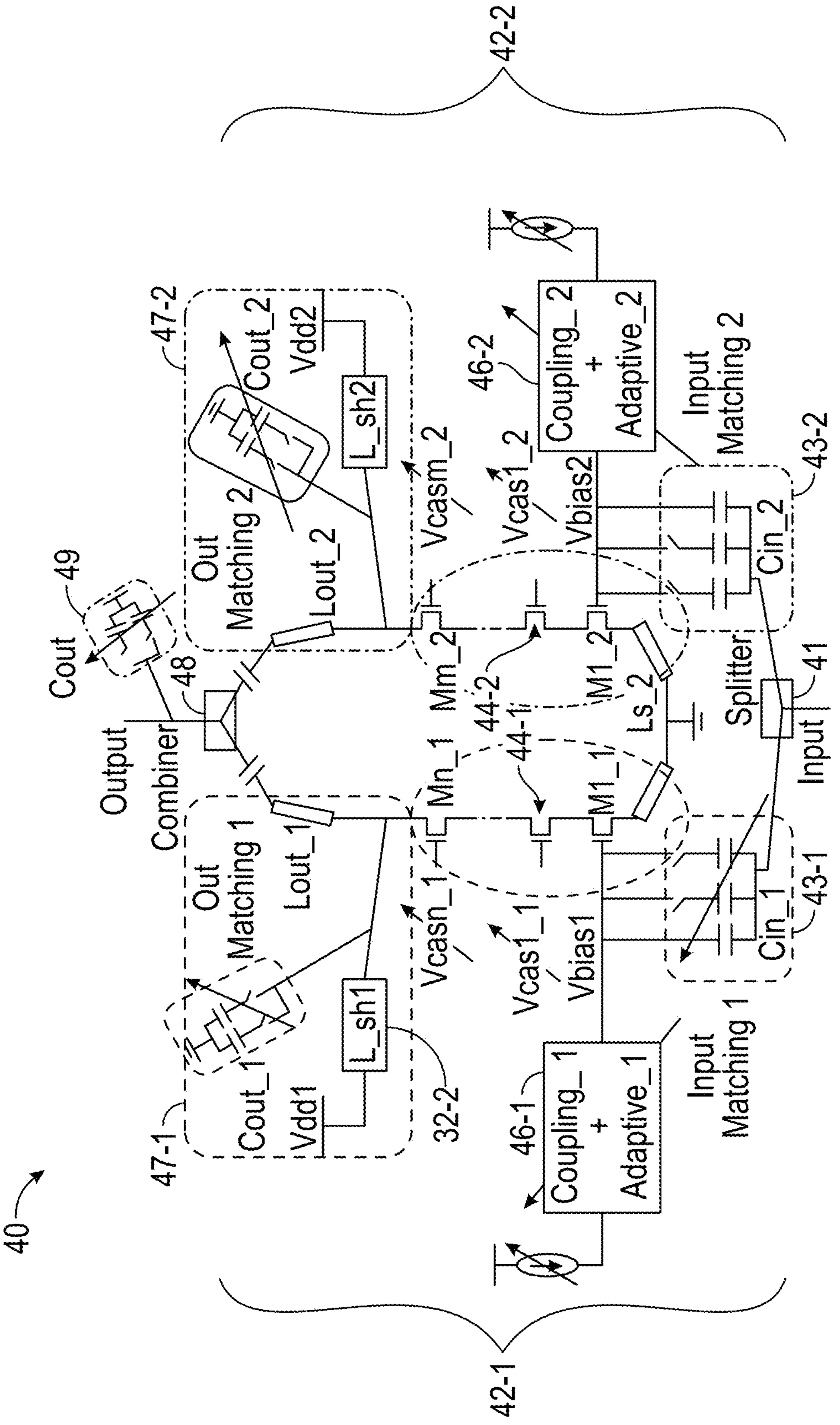
FIG. 4 is a schematic diagram of an example programmable multi-core power amplifier according to an embodiment.

FIG. 4 is a schematic diagram of an example multi-core power amplifier circuit 40 according to an embodiment. The multi-core power amplifier circuit 40 can be programmed differently for different output load impedances. For example, the multi-core power amplifier circuit 40 can be programmed differently for different antenna impedances associated with VSWR variation during beam steering when the power amplifier circuit 40 drives an antenna element of a phased antenna array.

The illustrated multi-core power amplifier circuit 40 includes a first power amplifier segment 42-1 and a second power amplifier segment 42-2 that are coupled in parallel with each other. The first power amplifier segment 42-1 includes a first input matching network 43-1 connected to an input node Input by way of a splitter 41, a first power amplifier core 44-1, a first adaptive bias and coupling circuit 46-1, and a first output matching network 47-1. The second power amplifier segment 42-2 includes a second input matching network 43-2 connected to the input node Input by way of the splitter 41, a second power amplifier core 44-2, a second adaptive bias and coupling circuit 46-2, and a second output matching network 47-2. Outputs of the power amplifier segments 42-1 and 42-2 can be combined with a combiner 48. A combined output matching network 49 can be coupled to an output node Output of the multi-core power amplifier circuit 40.

The multi-core power amplifier circuit 40 includes several programmable circuits that can be adjusted to tune performance. One or more of the programmable circuits can be adjusted based on load impedance such that the one or more programmable circuits are programmed differently for different load impedances. Any suitable combination of the programmable circuits of the multi-core power amplifier circuit 40 can be implemented in a power amplifier.

The first input matching network 43-1 and the second input matching network 43-2 can each be programmable. Impedances of the input matching networks 43-1 and 43-2 can control a power splitting ratio and an input power phase difference between power amplifier cores 44-1 and 44-2. As illustrated, the input matching networks 43-1 and 43-2 each include a switched capacitor bank Cin_1 and Cin_2, respectively. Each capacitor of the switched capacitor bank Cin_1 or Cin_2 can be electrically coupled or electrically isolated from a node (e.g., an input to a power amplifier core) using a respective switch. Programmability can be achieved in the first input matching network 43-1 and/or the second input matching network 43-2 using one or more digital control bits. The one or more digital control bits can select which capacitors of a capacitor bank Cin_1 and/or Cin_2 to switch in and to switch out. Any other suitable adjustable input matching networks can alternatively or additionally be implemented.

The first adaptive bias and coupling circuit 46-1 and the second adaptive bias and coupling circuit 46-2 can be programmed. A coupling circuit of the first adaptive bias and coupling circuit 46-1 and/or the second adaptive bias and coupling circuit 46-2 can be programmed to control an amount of power coupling from a bias circuit to a power amplifier core. An adaptive bias and linearization circuit of the first adaptive bias and coupling circuit 46-1 and/or the second adaptive bias and coupling circuit 46-2 can be programmed to control a linearization level of a power amplifier core 44-1 and/or 44-2. For example, the adaptive bias and linearization circuit 46-1 can include a bank of switchable resistors to control linearization device bias. Such an adaptive bias and linearization circuit can be programmed using one or more digital control bits. Any other suitable programmable circuits for coupling and/or linearization can alternatively or additionally be implemented in the first adaptive bias and coupling circuit 46-1 and/or the second adaptive bias and coupling circuit 46-2.

One or more bias voltages for a power amplifier core 44-1 and/or 44-2 can be adjusted in programming the multi-core power amplifier circuit 40. The illustrated power amplifiers 44-1 and 44-2 each include cascode transistors. A first power amplifier vias voltage Vbias1 and/or one or more of the cascode bias voltages Vcas1_1 to Vcasm_1 for cascode transistors of the first power amplifier 44-1, respectively, can be adjusted to control biasing of the first power amplifier 44-1. A second power amplifier vias voltage Vbias2 and/or one or more of the cascode bias voltages Vcas1_2 to Vcasm_2 for cascode transistors of the second power amplifier 44-2, respectively, can be adjusted to control biasing of the second power amplifier 44-2.

The first output matching network 47-1 and the second output matching network 47-2 can each be programmable. As illustrated, the output matching networks 47-1 and 47-2 each include a plurality of switched capacitors. Programmability can be achieved in the first output input matching network 47-1 and/or the second output matching network 47-2 using one or more digital control bits. Any other suitable adjustable output matching networks can alternatively or additionally be implemented.

The combined output matching network 49 can be programmable. As illustrated, the combined output matching network 49 can include a plurality of switched capacitors. Any other suitable adjustable combined output matching network can alternatively or additionally be implemented.

Figure 5:
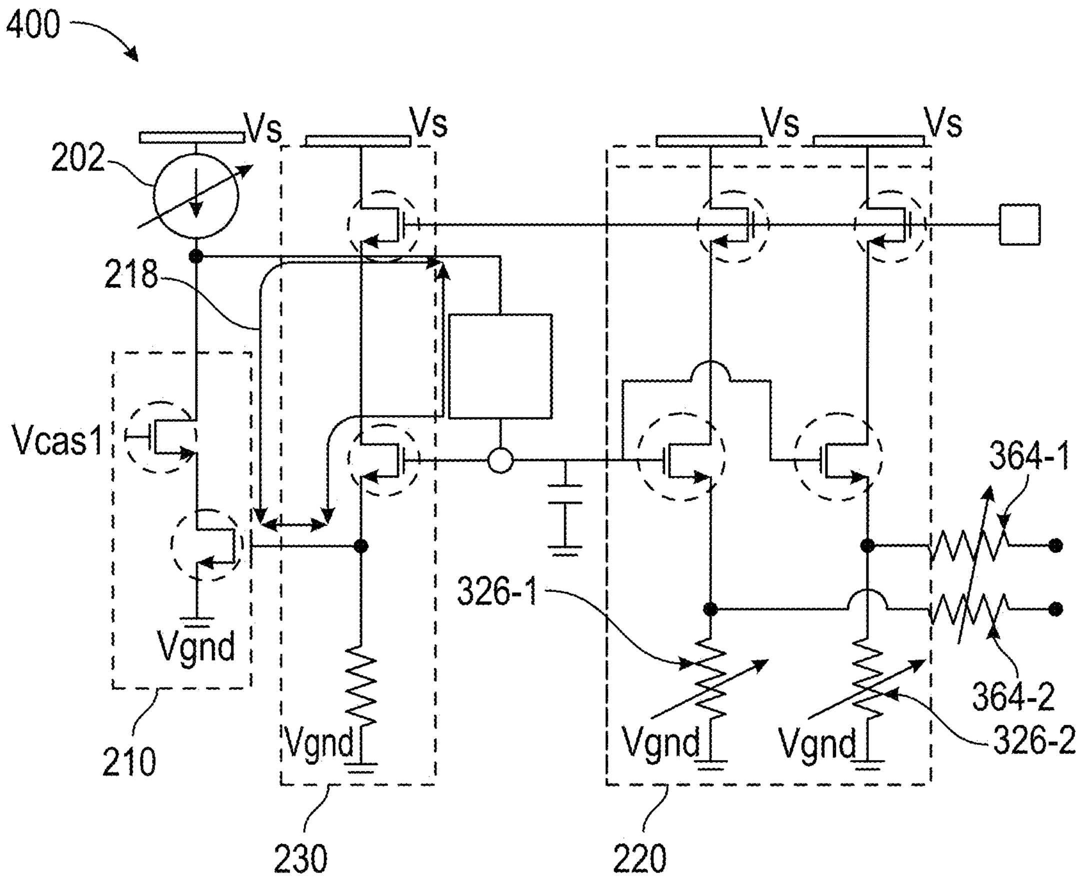
FIG. 5 is a schematic diagram of an example adaptive bias and coupling circuit of FIG. 4.

FIG. 5 is a schematic diagram of an example adaptive bias and coupling circuit 400. The adaptive bias and coupling circuit 400 is an example of the first adaptive bias and coupling circuit 46-1 of FIG. 4. The adaptive bias and coupling circuit 400 can alternatively or additional implement the second bias and coupling circuit 46-2 of FIG. 4. The adaptive bias and coupling circuit 400 can function as described in U.S. Patent Publication No. 2022/0094306, incorporated by reference above. The adaptive bias and coupling circuit 400 can generate an adaptive power amplifier bias signal that changes as a function of input power. The adaptive power amplifier bias signal can be a voltage or a current. The adaptive bias and coupling circuit 400 can also generate a non-direct current signal component to cancel power amplifier non-linearities to improve overall linearity.

As illustrated, the adaptive bias and coupling circuit 400 includes a bias circuit 210, a linearization circuit 220, and linearizer coupling circuit 230, and coupling circuit including adjustable resistors 364-1 and 364-2. The adaptive bias and coupling circuit 400 includes a feedback path coupling an output of the linearizer coupling circuit 230 to the input of the bias circuit 210, thus forming a biasing loop. The adjustable resistors 326-1 and/or 326-2 can be programmed to adjust the linearization circuit 220. In some instances, the adjustable resistors 326-1 and/or 326-2 can be replaced by current source(s). The adjustable resistors 364-1 and/or 364-2 can be programmed to adjust the coupling circuit. An adjustable current source 202 can generate a signal for the bias circuit 210.

Power Amplifier Systems with Phased Antenna Arrays

Programmable power amplifier circuits can be implemented in phased antenna array systems for beamforming. A radio frequency system can include a phased antenna array and a plurality of power amplifiers arranged to drive the phased antenna array. A first power amplifier of the plurality of power amplifiers can drive a first antenna element of the phased antenna array. The first power amplifier can be programmable based on impedance of the first antenna element such that the first power amplifier is programmed differently for different impedances of the first antenna element. The radio frequency system can perform beam scanning, and the impedance of the first antenna element varies as the radio frequency system performs beam scanning.

Figure 6A:
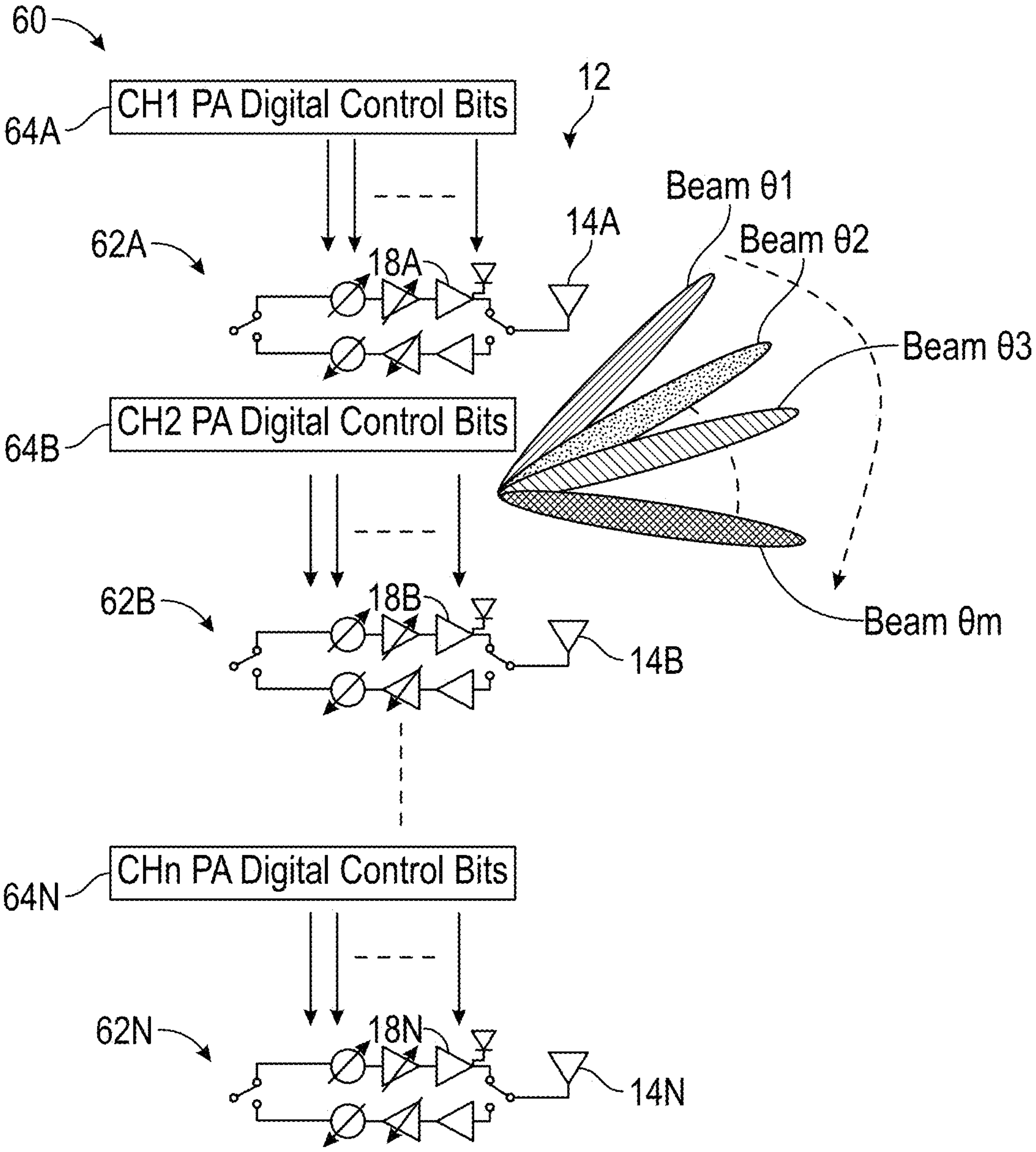
FIG. 6A is a schematic diagram of a power amplifier system with a phased antenna array that performs beam scanning according to an embodiment.

FIG. 6A is a schematic diagram of a power amplifier system 60 with a phased antenna array that performs beam scanning according to an embodiment. The power amplifier system 60 includes a plurality of processing channels 62A to 62M and a phased antenna array 12 including antenna elements 14A, 14B, . . . , 14N. Each processing channel 62A, 62B, . . . , 62N includes a respective power amplifier 18A, 18B, . . . , 18N. In certain applications, power amplifiers 18A to 18N can each be multi-core power amplifiers that are programmable in accordance with any suitable principles and advantages disclosed herein. A control circuit 64A, 64B, . . . , 64N can be included for programming a respective power amplifier 18A to 18N.

For illustrative purposes, part of the phased antenna array 12 is shown in FIG. 6A. The phased antenna array 12 can include an array of at least 6 antenna elements by 6 antenna elements in certain applications. In relatively large phased antenna arrays (e.g., antenna arrays with at least 6 rows and 6 columns of antenna elements), most (e.g., greater than 70%) of power amplifiers 18A to 18N of processing channels 62A to 62N, respectively, have substantially similar or the same VSWR variations during beam scanning. In such cases, the same or similar power amplifier programming can be applied to all of the power amplifiers 18A to 18N. In some instances, the same or similar power amplifier programming can be applied to most (e.g., greater than 70%) of the power amplifiers 18A to 18N. In various instances, the same or similar power amplifier programming can be applied to any suitable subset of the power amplifiers 18A to 18N.

Measurements and optimization using an over-the-air setup for at least at one beam direction can be performed. Individual parameter sweeps and/or nested sweeps between parameters can be performed to determine one or more power amplifier parameters to achieve a desired performance. Such measurements can include, but are not limited to, one or more of error vector magnitude (EVM), AM-AM, or adjacent channel power (ACP). The power amplifier parameter(s) can be swept by programming one or more circuits of the power amplifiers 18A to 18N. For example, one or more circuits of the multi-core power amplifier circuits 30 and/or 40 can be programmed to adjust the power amplifier parameter(s). From measurements associated with the parameter sweep(s), power amplifiers 18A to 18N can be calibrated for one or more than one beam position. The calibration data can be stored to non-transitory memory. During operation, the calibration data for a beam angle can be used to program a multi-core power amplifier circuit. The calibration data can be accessed and applied to a power amplifier based on detecting VSWR. Alternatively or additionally, the calibration data can be accessed and applied to a power amplifier based on data indicative of the beam angle.

FIG. 6B is a table summarizing example control bits for power amplifiers 18A to 18N for different beam positions according to an embodiment. This table summarizes each beam position with desired azimuth and elevation angles for M beams, and desired and/or optimum power amplifier parameters that correspond to each beam position. The power amplifier control bits can be applied to all power amplifiers. In certain applications, the control bits can be the same for each power amplifier 18A to 18N. The power amplifier control bits in the Table of FIG. 6B can be for two power amplifier segments of a dual core power amplifier of each processing channel. In some other applications, calibration can be performed for a plurality of processing channels that each include a single core power amplifier and the single core power amplifiers can be programmed for different beam angles of a beam scan.

Any suitable method can be used to store and/or apply the control bits, such as, but not limited to, initialization code, a look up table (LUT), memory, etc. Calibration can be performed during production testing. Calibration can be performed for phased antenna arrays with any suitable number of antenna elements. In certain applications where the phased antenna array is 6 antenna elements by 6 antenna elements or larger, calibration and power amplifier programming can provide higher effectiveness than for smaller phased antenna arrays.

If the available LUT or memory or code is relatively large, settings for each power amplifier channel can be optimized. Optimizing settings for each power amplifier channel can be performed for relatively smaller phased antenna arrays when there are memory constraints.

Any suitable memory and control circuit can be used to program power amplifiers in accordance with any suitable principles and advantages disclosed herein. Power amplifier control bits can be stored in any suitable memory. Any suitable control circuit 64A to 64N can apply the power amplifier control bits to a respective power amplifier 18A to 18N in the power amplifier system 60 of FIG. 6A based on a beam identifier. Alternatively or additionally, a control circuit can use any other indication of power amplifier load impedance can to select and apply power amplifier control bits for a power amplifier. In some instances, a control circuit can be provided per processing channel. In certain instances, a control circuit can provide power amplifier control bits to power amplifiers in two or more processing channels. Memory storing power amplifier control bits can be implemented together with or separate from control circuits. A memory with power amplifier control bits can be shared by a plurality of control circuits. Alternatively or additionally, a separate memory can be used by each control circuit.

Calibration and Determining Power Amplifier Parameters

Power amplifier parameters can be determined using a variety of calibration methods. Calibration data for power amplifier programming for load impedance variation can be performed with a method that includes determining one or more power amplifier parameters for a power amplifier for a first load impedance, determining the one or more power amplifier parameters for the power amplifier for a second load impedance that is different than the first load impedance, and storing the one or more power amplifier parameters for the first impedance and for the second impedance to memory such that they are accessible to program the power amplifier. In certain embodiments, calibration data can be generated for different beam angles. A first beam having a first beam angle can be generated using a phased antenna array, and one or more power amplifier parameters can be determined for the first beam angle. A second beam having a second beam angle can be generated using the phased antenna array, and one or more power amplifier parameters can be determined for the second beam angle. The one or more power amplifier parameters for the first and second beam angles can be stored to memory. These power amplifier parameters are accessible to program the power amplifier.

Example calibration methods will be discussed with reference to FIGS. 7 to 9B. Any suitable principles and advantages of these calibration methods can be implemented together with each other and/or any of the power amplifier circuits disclosed herein.

Figure 7:
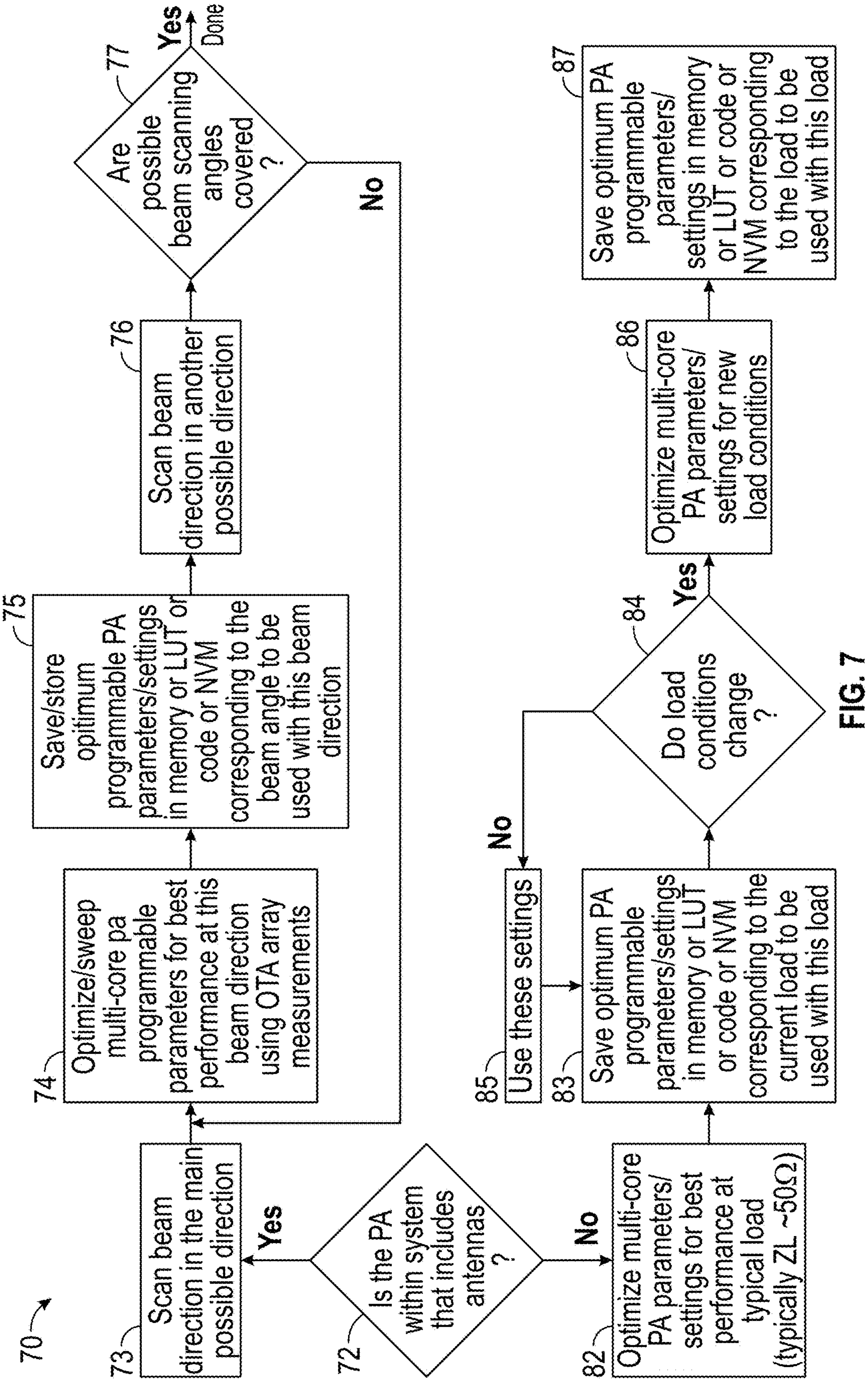
FIG. 7 is a flow diagram of a calibration method according to an embodiment.

FIG. 7 is a flow diagram of a calibration method 70 according to an embodiment. The calibration method 70 can be performed to determine one or more power amplifier settings for a multi-core power amplifier as output impedance varies. The calibration method 70 can perform different operations depending on whether a power amplifier is included in a system that includes antenna. Calibration can be performed during production testing, during a first use in the field, at start up, periodically, intermittently, or any suitable combination thereof.

At block 72, whether the power amplifier is included in a system that includes antennas can be determined. In some instances, the power amplifier can be included in a system without an antenna before the power amplifier is deployed in a communications system.

If antennas are included in the system, a beam direction can be scanned in a main direction at block 73. One or more parameters of a multi-core power amplifier circuit can be swept and/or optimized for a desired or best performance at a particular beam direction using over-the-air array measurements at block 74. Optimal and/or desirable power amplifier parameter(s) associated with the particular beam direction are stored in non-transitory storage at block 75. Then the beam is scanned in another beam direction at block 76. Whether all beam scanning angles are covered is determined at block 77. If the desired beam directions are not covered, power amplifier parameters are determined for the other beam direction and stored. This can involve sweeping power amplifier parameters at block 74 and storing optimum and/or desirable parameters to memory at block 75 for the other beam angle. Sweeping power amplifier parameters and storing the power amplifier parameters to memory can be iterated for one or more additional beam scanning angles until a set of desired beam angles are covered. When the desired beam scanning angles are covered, calibration can be complete. After calibration is complete in systems that include antennas, power amplifier parameters can be stored in memory for a plurality of beam angles.

On the other hand, if antennas are not included in the system, one or more parameters of a programmable multi-core power amplifier can be determined for desired performance for a typical load impedance, such as 50 Ohms, at block 82. The optimum and/or desired parameter(s) associated with the typical load impedance can be saved to non-transitory storage at block 83. Whether load conditions change can be determined at block 84. If load conditions do not change, then the parameter(s) for the typical load impedance be used at block 85. On the other hand, if load conditions change, one or more parameters for the programmable multi-core power amplifier can be determined and/or optimized for the new load condition at block 86. Then the optimal and/or desirable parameter(s) for the new load condition can be stored in non-transitory storage for use with the new load condition at block 87. When antennas are not included in the system, power amplifier parameters can be stored for current load conditions and accessed for programming a power amplifier circuit for the current load condition.

Figure 8A:
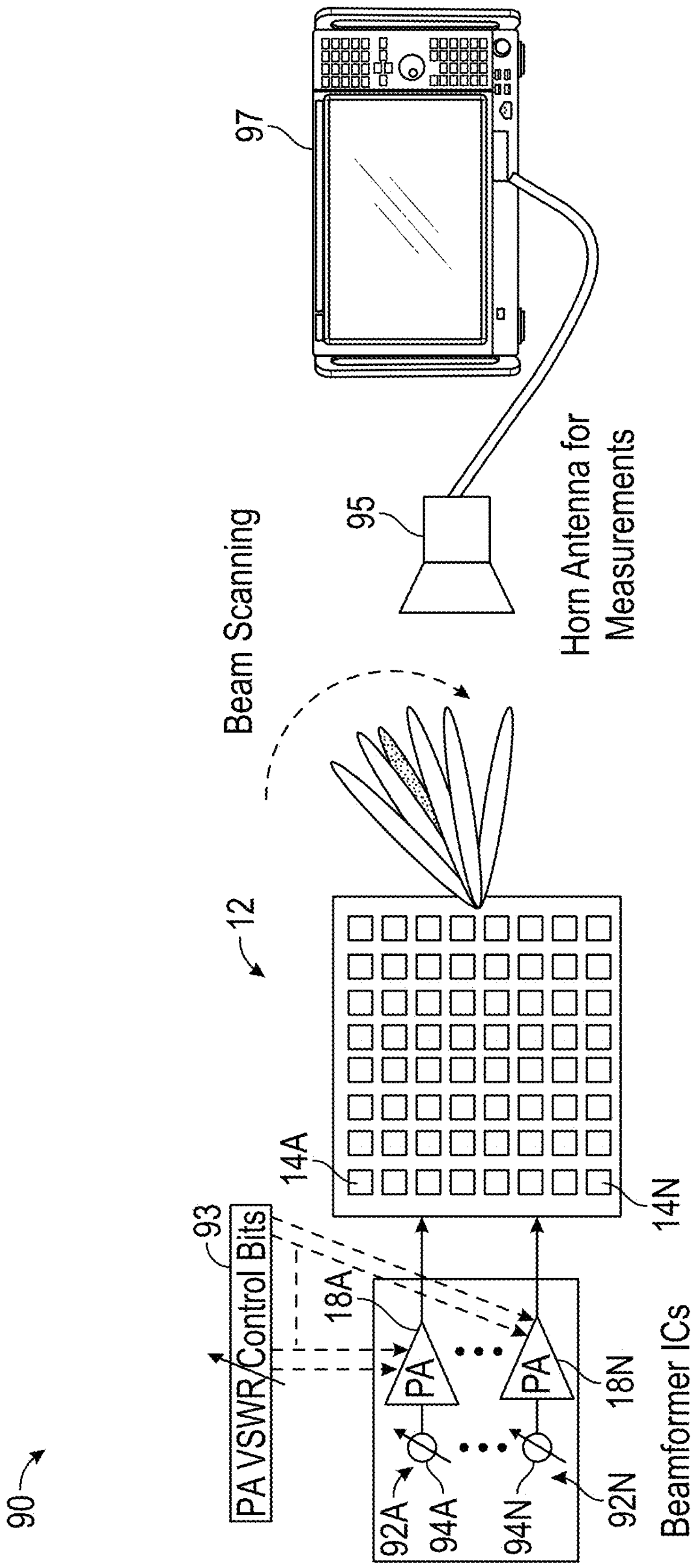
FIG. 8A is a schematic diagram related to calibration for a power amplifier system that includes antennas according to an embodiment.

FIG. 8A is a schematic diagram related to calibration for a power amplifier system 90 that includes antennas 14 according to an embodiment. As illustrated, the power amplifier system 90 includes processing channels 92A to 92N on one or more beamformer integrated circuits, a control circuit 93, and a phased antenna array 12. The processing channels 92A to 92N each include a respective vector modulator of phase shifter 94A to 94N and a power amplifier 18A to 18N. Each processing channel 92A to 92N can drive a respective antenna element 14A to 14N of the phased antenna array 12.

Vector modulators or phase shifters 94A to 94N for each channel in a beamformer can be set to achieve a desired azimuth angle and elevation angle to generate a first beam with the phased antenna array 12. The generated beam can be received by a receiving antenna 95. The receiving antenna 95 can be a horn antenna, for example, as illustrated. The received signal performance can be analyzed. This analyzing can involve measuring one or more of: EVM, ACP, AM-AM, or gain vs power. Measurements can be generated using any suitable measurement equipment 97, such as UXA measurement equipment or a PNA measurement equipment, for example.

Sweeps can be applied to power amplifier control bits (e.g., power amplifier VSWR programmable bits) to achieve a desired performance. The control circuit 93 can apply the power amplifier control bits to one or more of the power amplifiers 18A to 18N. Optimum and/or desired power amplifier control bits corresponding to a measured beam identifier with the beam table memory to be applied to the power amplifiers with the beam can be stored in non-transitory storage For example, the control circuit 93 can include memory to store the power amplifier control bits. The beam can change angle and then the operations can be repeated for a new beam generated using the phased antenna array 12. These operations can be performed for each beam of a beam scan.

Figures 8B, 9A:
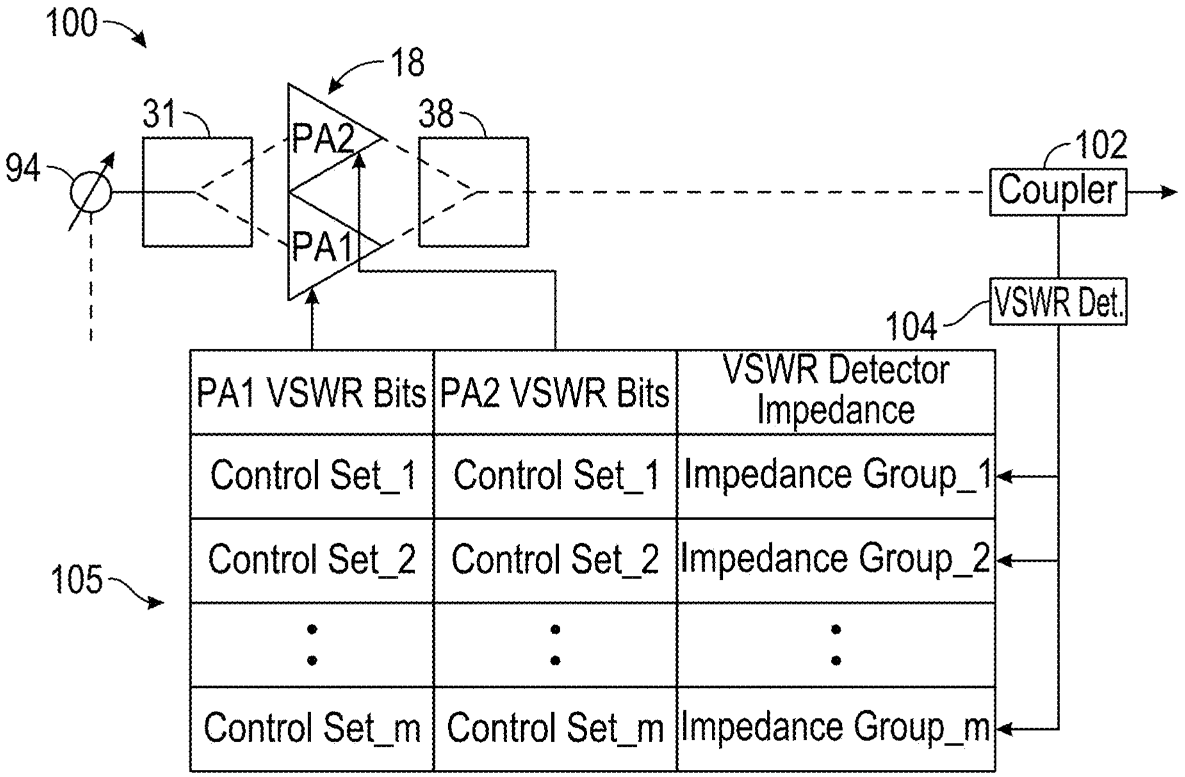
FIG. 8B is a table that includes power amplifier control bits for various beam identifiers according to an embodiment.
FIG. 9A is a schematic diagram related to calibration for a power amplifier system without antennas according to an embodiment.

FIG. 8B is a table that includes power amplifier control bits for various beam identifiers. The beam identifiers can represent a combination of azimuth angle and elevation angle. These power amplifier control bits can be generated during the sweeps discussed with reference to FIG. 8A. Power amplifier control bits for each beam identifier can be stored in memory for a first power amplifier core of a multi-core power amplifier circuit and a second power amplifier cores of the multi-core power amplifier circuit. The multi-core power amplifier circuit can be any of the power amplifiers 18A to 18N of FIG. 8A. Memory can store power amplifier control bits that can be used for one or more of the power amplifiers 18A to 18N. In certain instances, two or more of the power amplifiers 18A to 18N can use the same power amplifier control bits. Power amplifier control bits can be applied to multi-core power amplifier circuits using the control circuit 93 of FIG. 8A.

FIG. 9A is a schematic diagram related to calibration for a power amplifier system without antennas according to an embodiment. A beamformer channel 100 includes a phase shifter 94, a power amplifier 18, a radio frequency coupler 102, and a detector 104. The power amplifier 18 includes two power amplifier cores connected between a splitter 31 and a combiner 38. Using the radio frequency coupler 102 and the detector 104 (e.g., a VSWR detector) connected to a power amplifier output, variations in power amplifier output impedance can be detected.

Figure 9B:
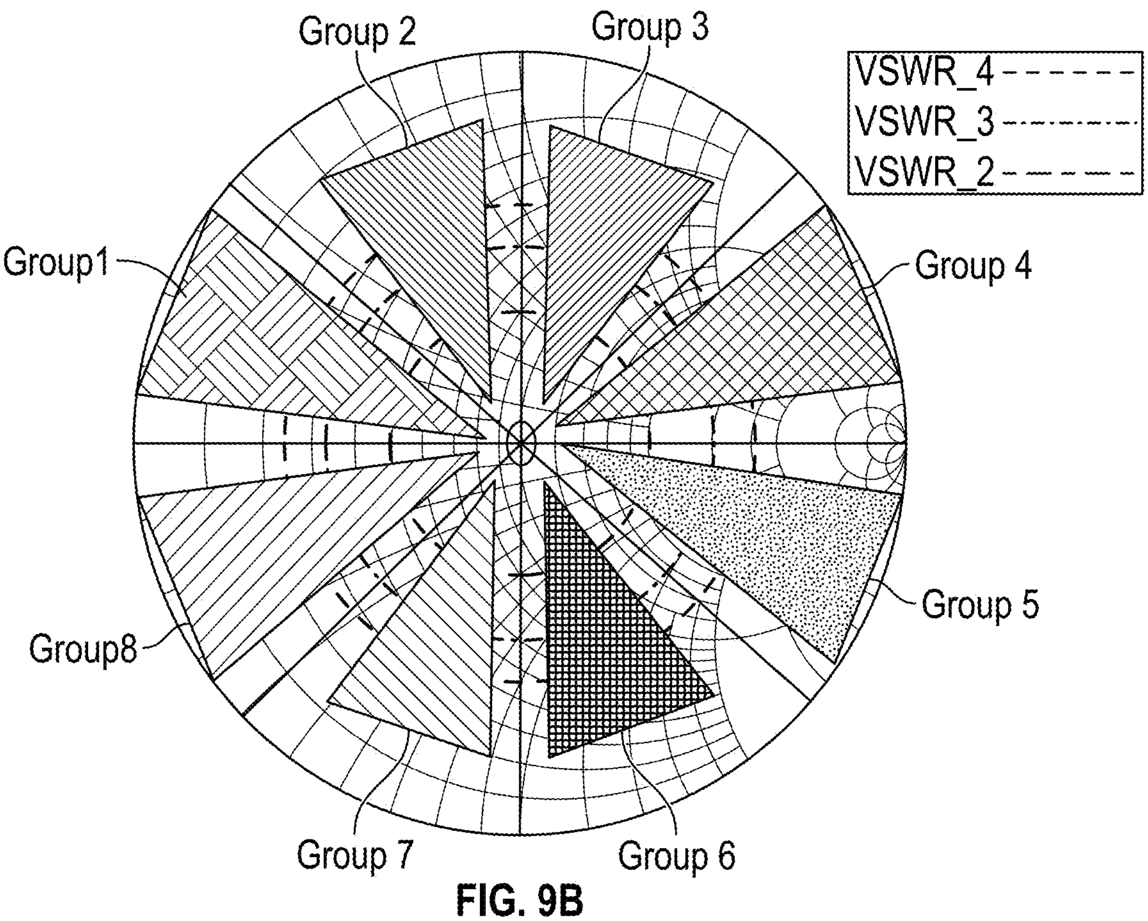
FIG. 9B is a Smith chart with impedance groups corresponding to detector impedances of FIG. 9A.

In some instances, an impedance area can be detected by connected impedances in an impedance group. In FIG. 9B, 8 impedance groups are shown on a Smith chart. The output impedance of the power amplifier 18 can be varied. Each impedance value or impedance group can correspond to an optimum and/or a desired set of programmable power amplifier parameters. Each set of values can be selected to achieve a desired power amplifier performance at each VSWR. Optimal and/or desired power amplifier control bits for each output impedance level can be stored to non-transitory storage, such as the memory 105 shown in FIG. 9A. For example, optimum power amplifier control bits can be burned to non-volatile memory after measurement optimizations. A corresponding set of power amplifier control bits can be stored to the memory 105 for each impedance group of FIG. 9B.

Power amplifier control bits stored in the memory 105 can be applied to individual cores of the power amplifier 18. Any suitable control circuit can apply the power amplifier control bits to program the power amplifier 18 for a corresponding output impedance of the power amplifier 18. For example, during operation, the detector 104 can detect an indication of power amplifier load impedance and the control circuit can program the power amplifier 18 with the corresponding power amplifier control bits.

Performance of Programmable Multi-core Power Amplifiers

Figure 10:
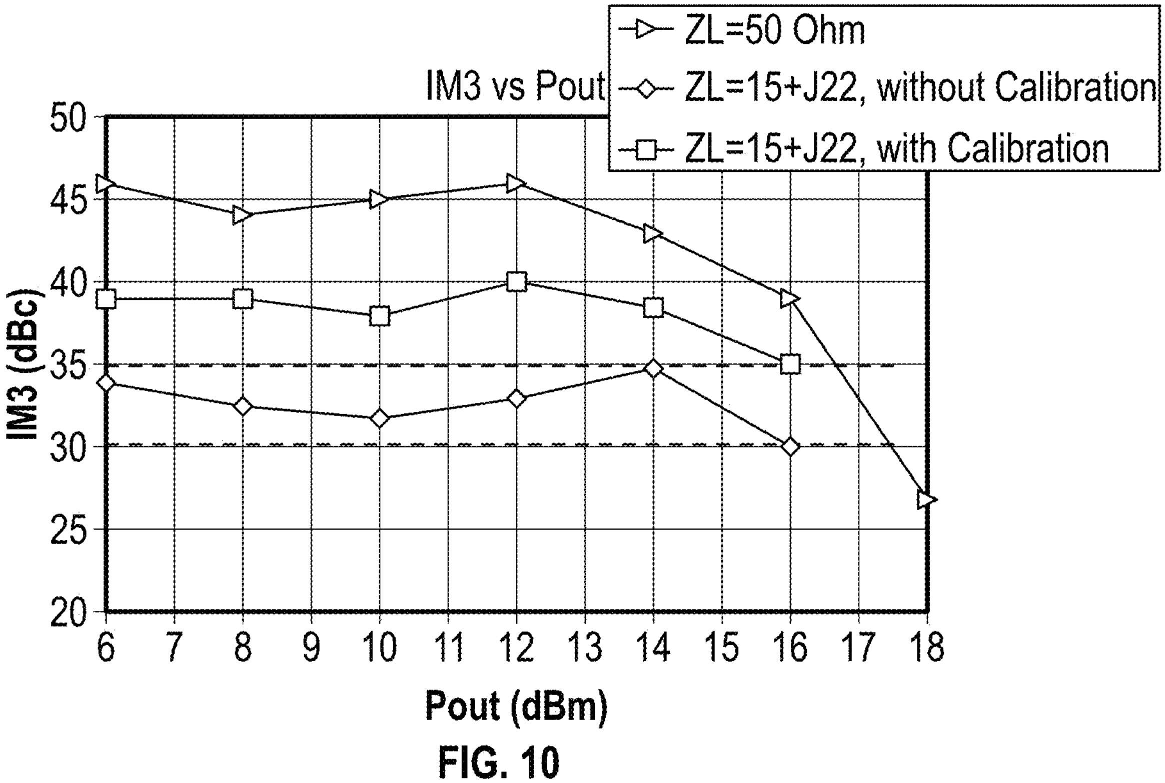
FIG. 10 is a graph of third order intermodulation distortion (IM3) versus output power showing improvements associated with programming a multi-core power amplifier according to an embodiment.

FIG. 10 is a graph of third order intermodulation distortion (IM3) versus output power showing improvements associated with programming a multi-core power amplifier according to an embodiment. The curves in FIG. 10 are associated with multi-core power amplifiers. A first curve represents IM3 versus output power for a load impedance of 50 Ohms. A second curve represents IM3 versus output power for a load impedance of 15+22j Ohms without calibration. A third curve represents IM3 versus output power for a load impedance of 15+22j Ohms with calibration in accordance with principles and advantages disclosed herein. The load impedance of 15+22j Ohms can correspond to a VSWR of 4. IM3 performance is improved with calibration for the impedance of 15+22j Ohms. With calibration, FIG. 10 indicates that IMD3 can remain above 35 dBc for a range of output powers.

Figures 11A, 11B, 11C:
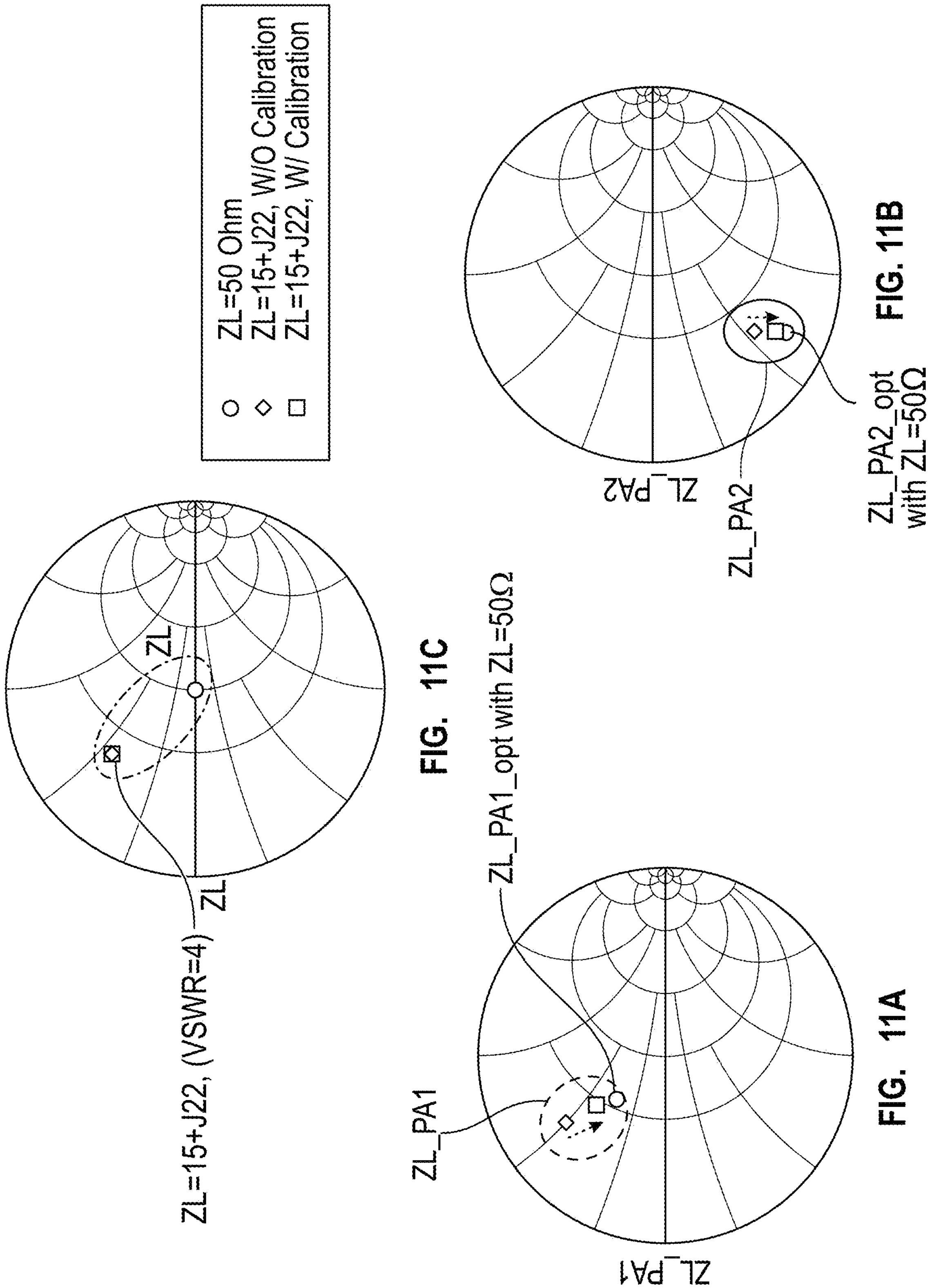
FIGS. 11A, 11B, and 11C are Smith charts for individual power amplifier cores and a segmented power amplifier showing improvements associated with programming a multi-core power amplifier according to an embodiment.

FIGS. 11A, 11B, and 11C are Smith charts for individual power amplifier cores and a segmented power amplifier showing improvements associated with programming a dual core power amplifier according to an embodiment. In this example, load impedance changes from 50 Ohms to 15+22j, which can correspond to a VSWR variation of 4:1.

The Smith chart of FIG. 11A for a first power amplifier core indicates that output impedance ZL_PA1 of the first power amplifier core deviates from optimum (ZL=50 Ohms) to a sub-optimum (ZL=15+j22 Ohms without calibration) impedance away from the optimum impedance with the change in load impedance ZL. The Smith chart of FIG. 11B for a second power amplifier core indicates that output impedance ZL_PA2 of the second power amplifier core deviates from optimum (ZL=50 Ohms) to a sub-optimum (ZL=15+j22 Ohms without calibration) impedance away from the optimum impedance with the change in load impedance ZL. FIG. 11C is a Smith chart for the output of the dual core power amplifier. Without calibration, the change in output impedance ZL at the output of the dual core power amplifier can cause linearity degradation.

With calibration for the dual core power amplifier parameters disclosed herein, output current Iout_PA1 and output voltage Vout_PA1 for the first power amplifier core and output current Iout_PA2 and output voltage Vout_PA2 for the second power amplifier core can be programmed for the changed load impedance. This can cause output impedance ZL_PA1 for the first power amplifier core and output impedance ZL_PA2 for the second power amplifier core to shift near an optimum value (ZL=15+j22 Ohms with calibration) where desirable power amplifier performance can be achieved. Simulated power amplifier linearity results in FIG. 10 correspond to the Smith charts of FIGS. 11A, 11B, and 11C.

Figure 12A:
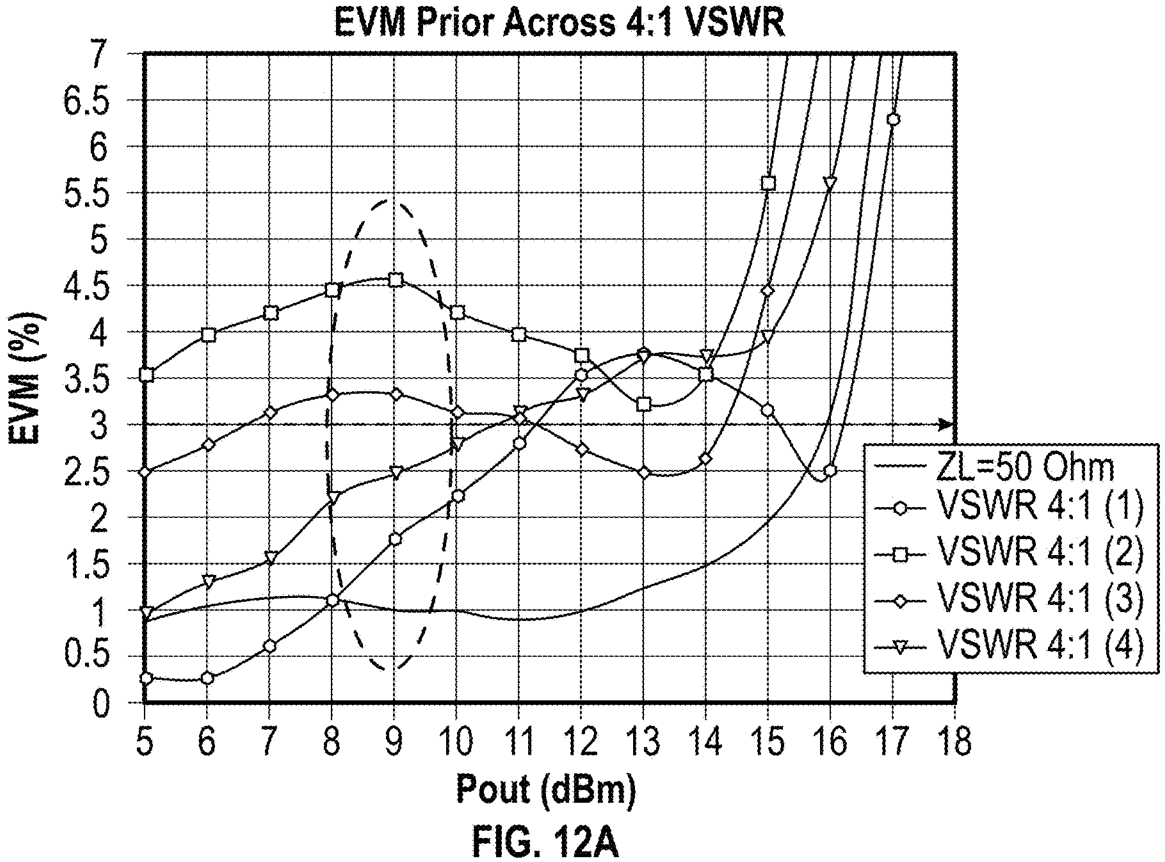
FIGS. 12A and 12B are graphs of error vector magnitude (EVM) that show improvements associated with programming a multi-core power amplifier according to an embodiment.
Figure 12B:
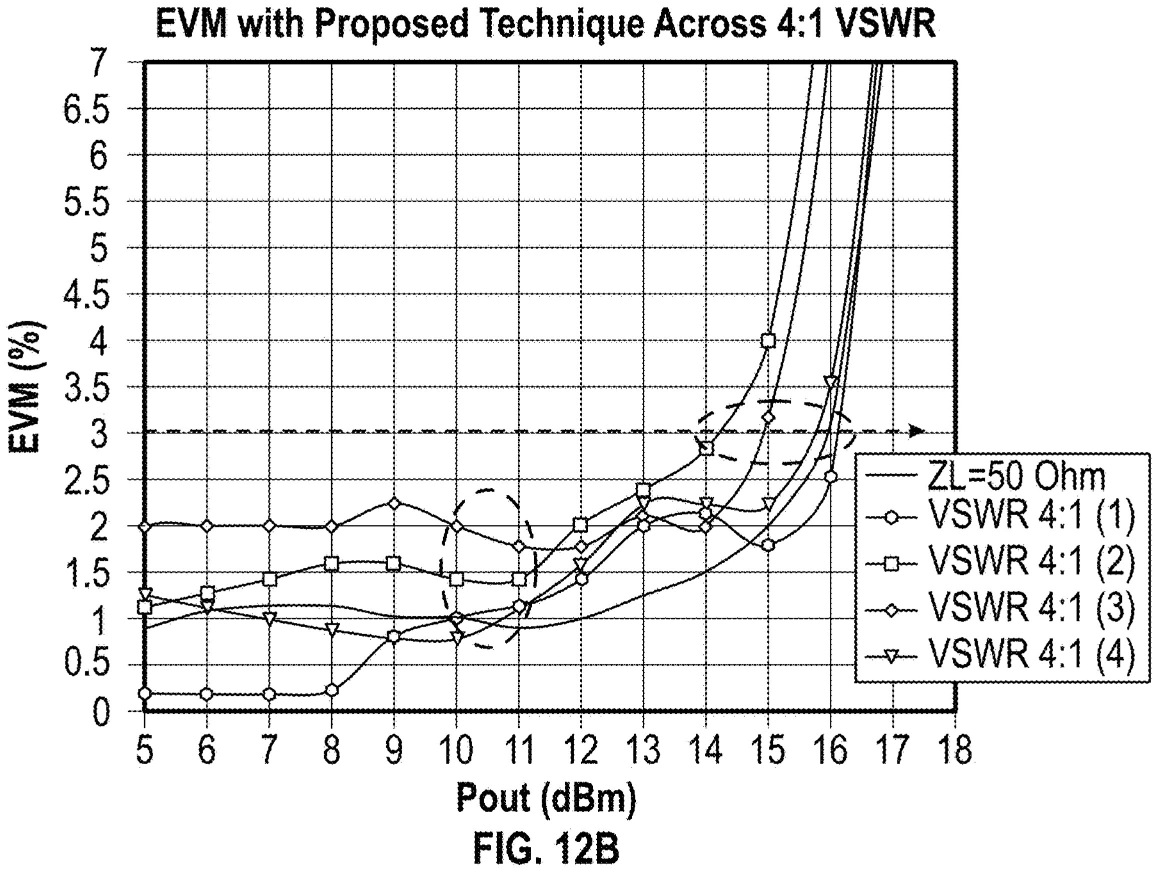

FIGS. 12A and 12B are graphs of error vector magnitude (EVM) that show improvements associated with programming a multi-core power amplifier according to an embodiment. FIG. 12A is a graph of EVM without applying power amplifier programming techniques disclosed herein. FIG. 12B is a graph of EVM where power amplifier programming techniques disclosed herein are applied. The graphs of FIGS. 12A and 12B each include curves for a 50Ω load impedance and VSWR variations of 4:1. EVM is a significant parameter for 5G and other communication systems. A system with less than 3% EVM can be desired. Under high VSWR variation, the EVM can exceed the desired 3% value, for example, as shown in FIG. 12A. With power amplifier programming disclosed herein, EVM performance can be maintained below 3% EVM, for example, as shown in FIG. 12B.

Figure 13A:
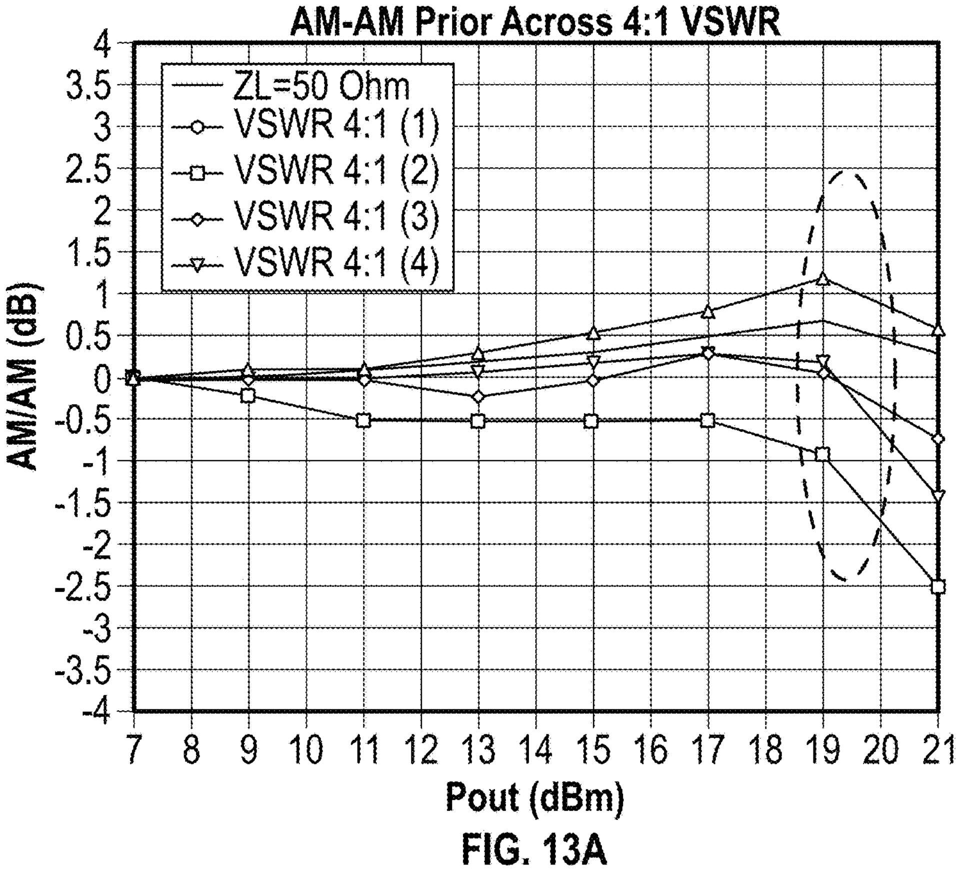
FIGS. 13A and 13B are graphs of normalized power amplifier gain that show improvements associated with programming a multi-core power amplifier according to an embodiment.
Figure 13B:
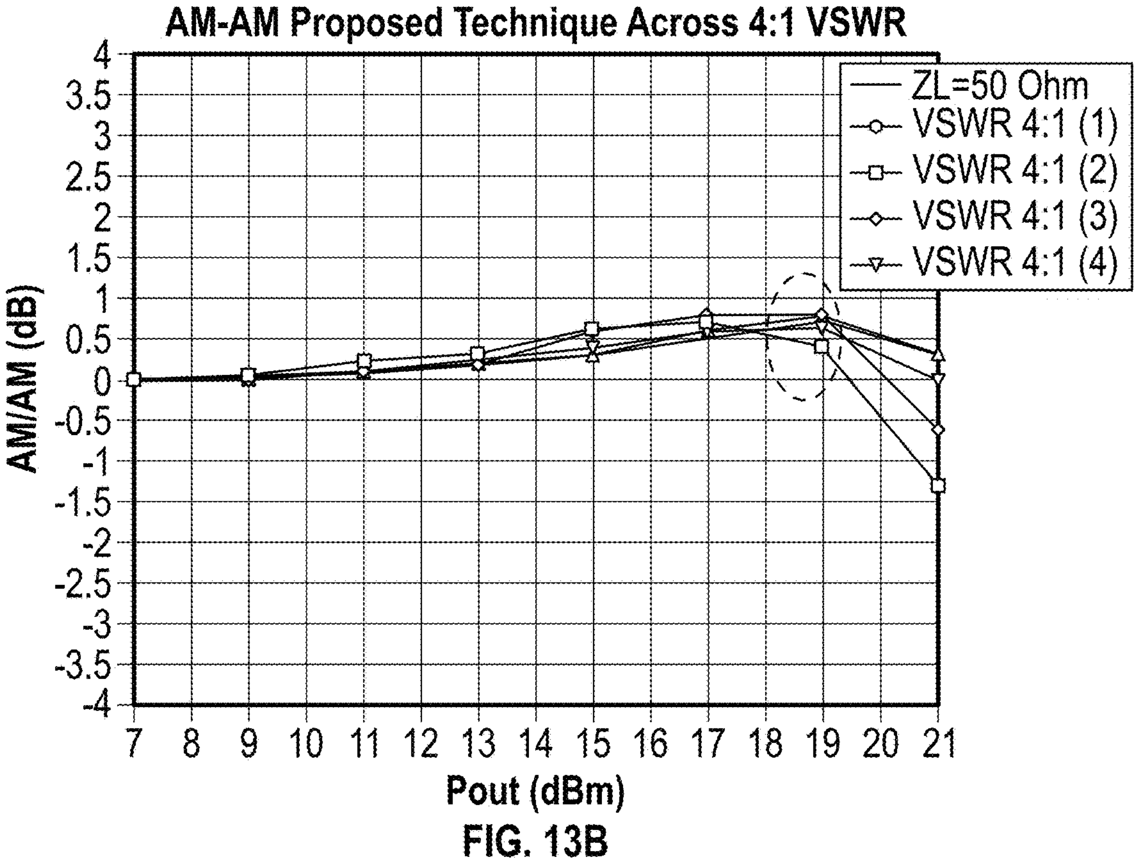

FIGS. 13A and 13B are graphs of normalized power amplifier gain that show improvements associated with programming a multi-core power amplifier according to an embodiment. AM-AM is a normalized gain. It can be desirable for AM-AM to be flat versus input power and output power. FIG. 13A is a graph of AM-AM without applying power amplifier programming techniques disclosed herein. FIG. 13B is a graph of AM-AM where power amplifier programming techniques disclosed herein are applied. Under VSWR variation of 4:1, there are AM-AM slope variations in FIG. 13A. FIG. 13A indicates that, under high output power and relatively high VSWR variation, there can be AM-AM variations without power amplifier programming disclosed herein. FIG. 13B indicates AM-AM flatness can be maintained for a range of output powers in the presence of relatively high VSWR variation with power amplifier programming disclosed herein.

Figure 14A:
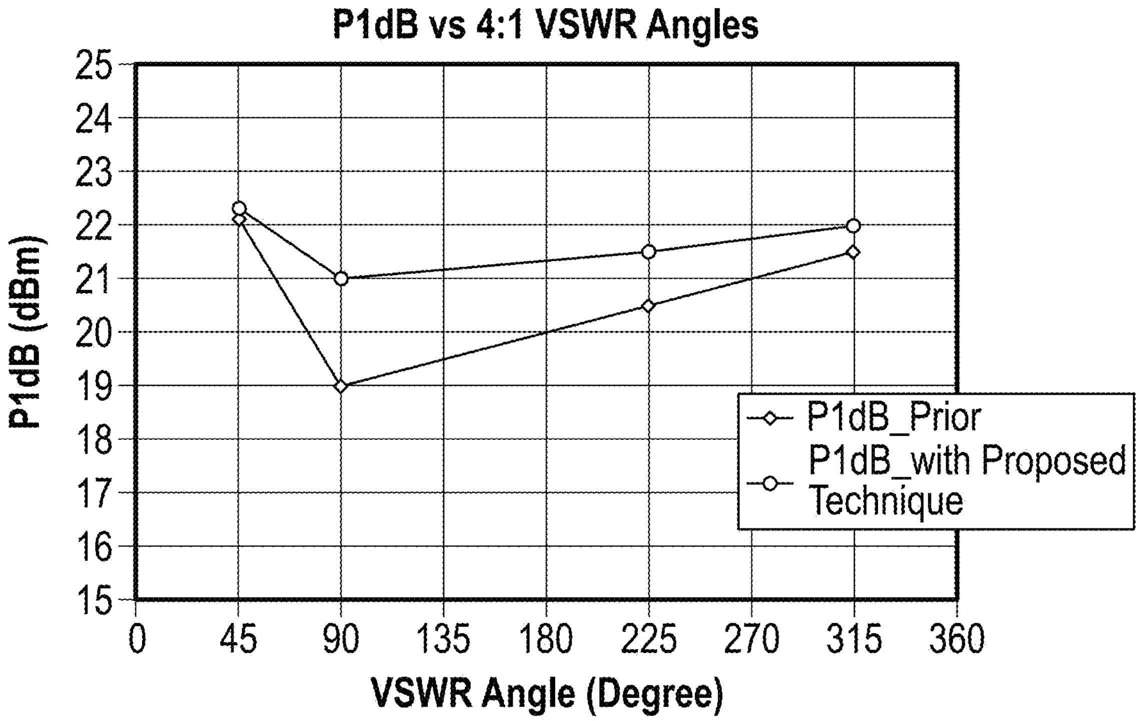
FIG. 14A is a graph of output power that shows improvements associated with programming a multi-core power amplifier according to an embodiment.

FIG. 14A is a graph of output power that shows improvements associated with programming a multi-core power amplifier according to an embodiment. A 1 dB compression point (P1dB) is a significant parameter for 5G communication systems. Typically, a system with low P1dB variation is desired. FIG. 14A shows that programming a multi-core power amplifier in accordance with principles and advantages disclosed herein there is less variation in P1dB over VSWR angles than without calibration.

Figure 14B:
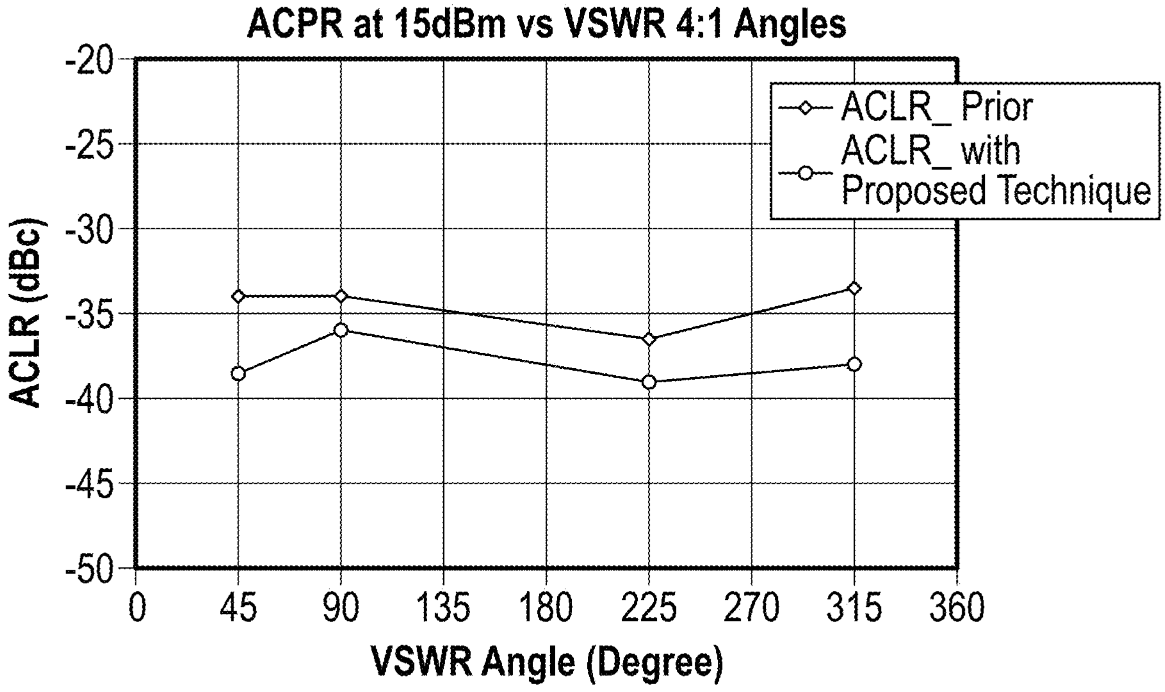
FIGS. 14B and 14C are graphs of adjacent channel power ratio at different power levels that show improvements associated with programming a multi-core power amplifier according to an embodiment.
Figure 14C:
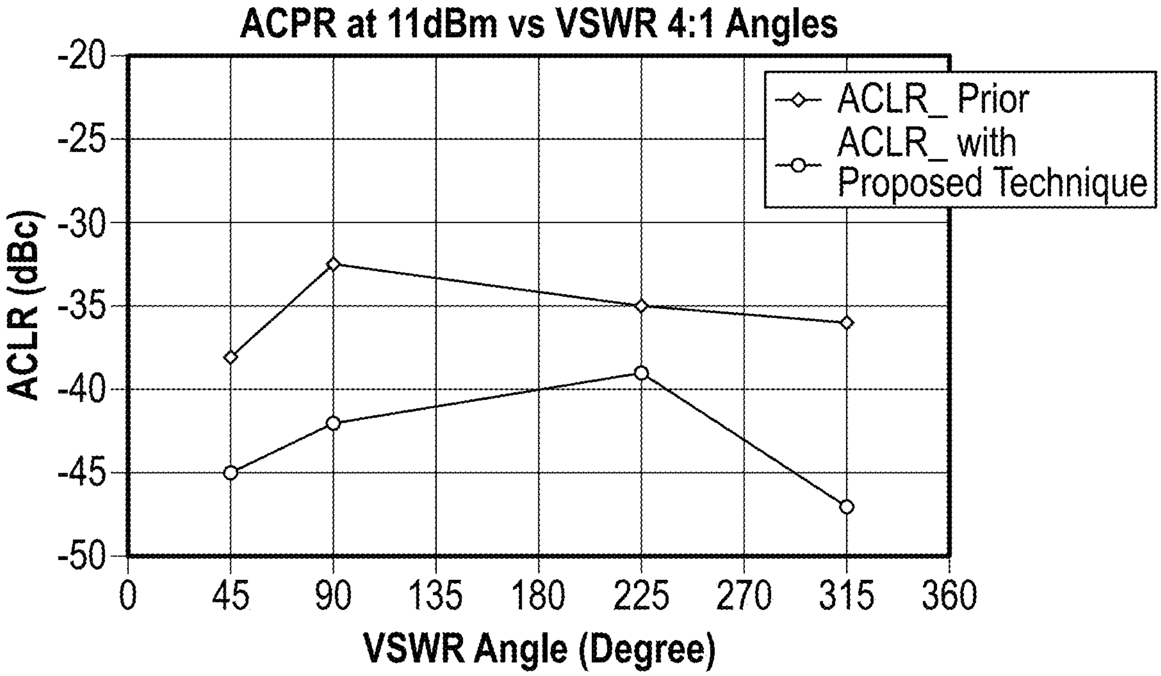

FIGS. 14B and 14C are graphs of adjacent channel power ratio (ACPR) at different power levels that show improvements associated with programming a multi-core power amplifier according to an embodiment. ACPR at different power level can represent out of band emissions. Reducing such out of band emissions can be desirable. FIG. 14B is a graph of ACPR at 15 dBm versus VSWR 4:1 angles. FIG. 14C is a graph of ACPR at 11 dBm versus VSWR 4:1 angles. FIGS. 14A and 14B indicates that programming a multi-core power amplifier as disclosed herein can improve ACPR over VSWR angles. Power amplifier programming disclosed herein can improve the ACPR versus 4:1 VSWR angles at different power levels.

Embodiments

Power amplifiers that are programmable to compensate for variations in load impedance are disclosed. In an embodiment, a power amplifier circuit includes at least two power amplifiers cores and includes programmable and/or switchable circuit in one or more of: a bias circuit for each power amplifier core that adjust bias voltage(s) and/or bias current(s) of each power amplifier core, a supply voltage circuit to adjust a supply voltage that biases transistors of a power amplifier core, an input matching network for each power amplifier core, an output matching network for each power amplifier core, a combined output matching network coupled between a combiner and a load, a coupling circuit that couples input power at each power amplifier core input to its adaptive bias circuit, or an adaptive bias circuit of each power amplifier core.

One or more programmable and/or switched parameters can be used to calibrate power amplifier performance versus load impedance and/or VSWR variation. A power amplifier can be programmed to increase and/or optimize performance at different load impedances and/or VSWRs. This programming can enhance one or more of linearity, efficiency, output power, gain, or one or more other power amplifier parameters.

Programmable biasing voltage(s) and/or current(s) can include programming transistor current mirrors and/or programming resistors that can be adjusted using one or more digital control bits.

Supply voltages of each power amplifier core can be programmed with any suitable programmable circuitry, such as a low drop out regular (LDO), DC-DC converter, or any other suitable sources that can generate DC voltage and/or current.

An input matching network for a power amplifier core can include at least one switch with one or more tunable impedance elements, such as one or more capacitors, one or more inductors, one or more transmission lines, one or more varactors, etc. to adjust input matching impedance. The at least one switch can be enabled or disabled with a control signal to adjust input power amplitudes and/or phase at each power amplifier core input. The control signal can be a digital signal or an analog signal.

An output matching network for a power amplifier core can include at least one switch with one or more tunable impedance elements, such as one or more capacitors, one or more inductors, one or more transmission lines, one or more varactors, etc. to adjust output matching impedance. The at least one switch can be enabled or disabled with a control signal to adjust output power amplitudes and/or phase at each power amplifier core input. The control signal can be a digital signal or an analog signal.

A combined output matching network can be coupled to an output of a combiner. The combined output matching network can include at least one switch with one or more tunable impedance elements, such as one or more capacitors, one or more inductors, one or more transmission lines, one or more varactors, etc. to adjust output matching. The at least one switch can be enabled or disabled with a control signal to adjust output impedance at the power amplifier output. The control signal can be a digital signal or an analog signal.

A coupling circuit can be coupled between each power amplifier core and its adaptive bias circuit. The coupling circuit can include at least one switch that can be enabled or disabled with a control signal to control amount of power coupling for the power amplifier core input to its adaptive bias circuit. The control signal can be a digital signal or an analog signal.

An adaptive bias circuit can be included at each power amplifier core to control linearity and/or gain expansion at different power levels. At least one adaptive bias circuit can include at least one or switch to control a desired gain expansion and the level of cancellation non-linearity of each power amplifier core. The at least one switch can be programmed with analog and/or digital control.

In an embodiment, a power amplifier circuit includes multiple cores. The number of active cores can be controller and programmed versus one or more of VSWR, temperature, process, or supply variations. The number of active cores can be controlled and programmed versus different power modes.

Embodiments disclosed herein relate to calibration methods. The calibration methods can generate control signals for power amplifiers for different load impedances and/or VSWR variations.

Although embodiments disclosed herein may be discussed with reference to particular power amplifier architectures, any suitable principles and advantages disclosed herein can be applied to any other suitable power amplifier system. For example, any suitable principles and advantages disclosed herein can be applied to single core power amplifiers in separate processing channels that drive separate loads (e.g., antennas).

In embodiments disclosed herein, VSWR sensitivity can be improved with multi-core power amplifiers by using one or more of programmable input matching, programmable linearization, programmable coupling circuit, or programmable biasing voltages. In some of these embodiments, two or more of these programmable circuits can be used to achieve desirable performance in the presence of VSWR variations.

In certain embodiments, a VSWR detector at a power amplifier output can detect a load impedance and the power amplifier can be programmed differently for different load impedances using a control signal. The control signal can include digital control bits. The digital control bits can be generated using a calibration method and stored in memory for use during operation.

Conclusion

In the embodiments described above, apparatus, systems, and methods for programmable power amplifiers are described in connection with particular embodiments. It will be understood, however, that the principles and advantages of the embodiments can be used for any other systems, apparatus, or methods with a need for a programmable power amplifier. Moreover, any suitable principles and advantages disclosed herein can be implemented in systems and in methods that include a power amplifier and transmit a radio frequency signal via one or more antennas.

The principles and advantages described herein can be implemented in various apparatuses. Examples of such apparatuses can include, but are not limited to, communications infrastructure such as wireless communications infrastructure, consumer electronic products, parts of the consumer electronic products, electronic test equipment, vehicular electronic products, industrial electronic products, etc. Electronic products can include, but are not limited to, base stations such as cellular base stations, access points, repeaters, relays, wireless communication devices, a mobile phone (for example, a smart phone), a hand-held computer, a tablet computer, a laptop computer, a wearable computing device, a vehicular electronics system, a radio, a wearable health monitoring device, etc. Further, apparatuses can include unfinished products.

Unless the context clearly requires otherwise, throughout the description and the claims, the words “comprise,” “comprising,” “include,” “including,” and the like are to be construed in an inclusive sense, as opposed to an exclusive or exhaustive sense; that is to say, in the sense of “including, but not limited to.” The words “coupled” or connected”, as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A radio frequency system with power amplifier programming for antenna impedance variation, the radio frequency system comprising:

a phased antenna array comprising a first antenna element and a second antenna element; and a plurality of power amplifiers comprising a first power amplifier operable to drive the first antenna element and a second power amplifier operable to drive the second antenna element, wherein the first power amplifier is programmable based on an impedance of the first antenna element, wherein the radio frequency system is operable to perform beam scanning, and wherein the impedance of the first antenna element varies as the radio frequency system performs beam scanning.

2. The radio frequency system of claim 1, wherein the first power amplifier comprises a multi-core power amplifier including a plurality of power amplifier cores, and each power amplifier core of the plurality of power amplifier cores is programmable based on the impedance of the first antenna element.

3. The radio frequency system of claim 1, wherein the second power amplifier is programmable based on an impedance of the second antenna element, wherein the impedance of the second antenna element varies as the radio frequency system performs beam scanning.

4. The radio frequency system of claim 1, wherein the second power amplifier is programmable based on the impedance of the first antenna element.

5. The radio frequency system of claim 1, wherein the first power amplifier is programmable to adjust at least one of a bias current or a bias voltage for the first power amplifier based on the impedance of the first antenna element.

6. The radio frequency system of claim 1, wherein the first power amplifier is programmable to adjust at least one of an input matching network or an output matching network based on the impedance of the first antenna element.

7. The radio frequency system of claim 1, wherein the first power amplifier is programmable to adjust an input matching network based on the impedance of the first antenna element to increase linearity of the first power amplifier.

8. The radio frequency system of claim 1, wherein the first power amplifier is programmable to adjust an adaptive bias circuit based on the impedance of the first antenna element to improve increase of the first power amplifier.

9. The radio frequency system of claim 1, wherein the first power amplifier is programmable to adjust at least two of the following based on the impedance of the first antenna element: a bias voltage, a bias current, an input matching network, or an output matching network.

10. The radio frequency system of claim 1, further comprising:

a radio frequency coupler in a signal path between the first power amplifier and the first antenna element; and a detector in communication with the radio frequency coupler, the detector operable to generate an indication of reflected radio frequency power, wherein the reflected radio frequency power is an indication of the impedance of the first antenna element, and wherein the first power amplifier is programmable based on the indication of reflected power.

11. The radio frequency system of claim 1, wherein the first power amplifier is programmable based on an indication of beam angle.

12. The radio frequency system of claim 1, wherein the phased antenna array comprises at least 36 antenna elements.

13. A method of power amplifier programming for antenna impedance variation, the method comprising:

programming a power amplifier driving an antenna element of a phased antenna array for a first impedance value of the antenna element, the first impedance value corresponding to the phased antenna array generating a first beam with a first beam angle, and the phased antenna array comprising a plurality of antenna elements that includes the antenna element;

programming the power amplifier for a second impedance value of the antenna element, the second impedance value being different than the first impedance value, the second impedance value corresponding to the phased antenna array generating a second beam with a second beam angle, the second beam angle being different than the first beam angle; and controlling the phased antenna array to generate the first beam and the second beam, wherein the power amplifier is programmed for the first impedance value while the first beam is generated, and wherein the power amplifier is programmed for the second impedance value while the second beam is generated.

14. The method of claim 13, further comprising accessing control information stored in memory associated with the first beam, wherein the programming the power amplifier for the first impedance value is based on the accessing.

15. The method of claim 13, further comprising detecting an indication of impedance of the antenna element and accessing control information stored in memory associated with the impedance of the antenna element, wherein the programming the power amplifier for the first impedance value is based on the accessing.

16. The method of claim 13, wherein the programming the power amplifier for the second impedance value comprises adjusting an input matching network of the power amplifier to improve linearity of the power amplifier.

17. The method of claim 13, wherein the programming the power amplifier for the second impedance value comprises adjusting an adaptive bias circuit of the power amplifier to improve linearity of the power amplifier.

18. The method of claim 13, wherein the power amplifier is a multi-core power amplifier comprising a plurality of power amplifier cores, and each power amplifier core of the plurality of power amplifier cores is programmable for generating the first beam and for generating the second beam.

19. The method of claim 13, further comprising programming a second power amplifier driving a second antenna element of the plurality of antenna elements differently for generating the first beam and for generating the second beam.

20. A radio frequency system with power amplifier programming for antenna impedance variation, the radio frequency system comprising:

a phased antenna array comprising a first antenna element and a second antenna element; and a plurality of power amplifiers comprising a first multi-core power amplifier operable to drive the first antenna element and a second multi-core power amplifier operable to drive the second antenna element, the first multi-core power amplifier comprising a matching network, wherein the first multi-core power amplifier is programmable to adjust at least the matching network and a bias signal of the first multi-core power amplifier based on impedance of the first antenna element, wherein the radio frequency system is operable to perform beam scanning, and wherein the impedance of the first antenna element varies as the radio frequency system performs beam scanning.

* * * * *